United States Patent
Baek et al.

(10) Patent No.: US 9,613,811 B2
(45) Date of Patent: Apr. 4, 2017

(54) METHODS OF MANUFACTURING SEMICONDUCTOR DEVICES

(71) Applicant: SAMSUNG ELECTRONICS CO., LTD., Gyeonggi-do (KR)

(72) Inventors: Jae-Jik Baek, Gyeonggi-do (KR); Sang-Jine Park, Gyeonggi-do (KR); Bo-Un Yoon, Seoul (KR); Young-Sang Youn, Gyeonggi-do (KR); Ji-Min Jeong, Seoul (KR); Ji-Hoon Cha, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/525,467

(22) Filed: Oct. 28, 2014

(65) Prior Publication Data

US 2015/0162197 A1    Jun. 11, 2015

(30) Foreign Application Priority Data

Dec. 6, 2013  (KR) .................. 10-2013-0151453

(51) Int. Cl.

| | | |
|---|---|---|
| *H01L 21/338* | (2006.01) | |
| *H01L 21/266* | (2006.01) | |
| *H01L 21/8234* | (2006.01) | |
| *H01L 21/8238* | (2006.01) | |
| *H01L 29/66* | (2006.01) | |

(52) U.S. Cl.

CPC .... *H01L 21/266* (2013.01); *H01L 21/823418* (2013.01); *H01L 21/823431* (2013.01); *H01L 21/823468* (2013.01); *H01L 21/823821* (2013.01); *H01L 29/66575* (2013.01)

(58) Field of Classification Search

CPC .......... H01L 21/266; H01L 21/823418; H01L 21/823431; H01L 21/823468; H01L 21/823821; H01L 29/66575
USPC ................. 438/180–185, 195–202, 216–233
See application file for complete search history.

(56) References Cited

U.S. PATENT DOCUMENTS

| | | |
|---|---|---|
| 5,897,357 A | 4/1999 | Wu et al. |
| 5,985,711 A | 11/1999 | Lim |
| 6,133,102 A | 10/2000 | Wu |
| 6,395,596 B1 * | 5/2002 | Chien ............ H01L 21/823418 257/E21.619 |
| 6,998,316 B2 | 2/2006 | Yang et al. |
| 7,892,906 B2 | 2/2011 | Mehrad et al. |

(Continued)

FOREIGN PATENT DOCUMENTS

| | | |
|---|---|---|
| JP | 04-107819 | 4/1992 |
| JP | 2001-332634 | 11/2001 |

(Continued)

*Primary Examiner* — H Tsai
(74) *Attorney, Agent, or Firm* — F. Chau & Associates, LLC

(57) ABSTRACT

A first protective layer, a mask layer, a second protective layer and a photoresist layer are sequentially formed on a substrate. A photoresist pattern is formed by partially removing the photoresist layer. An ion implantation mask is formed by sequentially etching the second protective layer, the mask layer and the first protective layer using the photoresist pattern. The ion implantation mask exposes the substrate. Impurities are implanted in an upper portion of the substrate exposed by the ion implantation mask.

17 Claims, 33 Drawing Sheets

(56) References Cited

U.S. PATENT DOCUMENTS

| | | |
|---|---|---|
| 7,981,817 B2 | 7/2011 | Hashimoto et al. |
| 8,043,922 B2 | 10/2011 | Lee et al. |
| 8,173,549 B2 | 5/2012 | Lee et al. |
| 8,227,354 B2 | 7/2012 | Kim et al. |
| 8,283,226 B2 | 10/2012 | Fukuda et al. |
| 2002/0020860 A1* | 2/2002 | Arai ............... H01L 27/105 257/260 |
| 2003/0036284 A1 | 2/2003 | Chou et al. |
| 2003/0151109 A1* | 8/2003 | Taniguchi ....... H01L 21/823418 257/500 |
| 2003/0232284 A1 | 12/2003 | Liu et al. |
| 2007/0148863 A1* | 6/2007 | Seo ................ H01L 27/10894 438/257 |
| 2007/0287244 A1 | 12/2007 | Shen et al. |
| 2008/0026572 A1* | 1/2008 | Wirbeleit ......... H01L 21/26513 438/663 |
| 2010/0173497 A1 | 7/2010 | Chang et al. |
| 2011/0201202 A1 | 8/2011 | Chang et al. |

FOREIGN PATENT DOCUMENTS

| | | |
|---|---|---|
| JP | 2003-248293 | 9/2003 |
| KR | 1020050002076 | 1/2005 |
| KR | 1020060073131 | 6/2006 |
| KR | 1020070027953 | 3/2007 |
| KR | 1020070066435 | 6/2007 |
| KR | 1020070103156 | 10/2007 |
| KR | 1020080001528 | 1/2008 |
| KR | 1020080004215 | 1/2008 |
| KR | 1020080061858 | 7/2008 |
| KR | 1020100059048 | 6/2010 |
| KR | 1020100131718 | 12/2010 |
| KR | 1020100134455 | 12/2010 |

\* cited by examiner

FIRST
DIRECTION
⊗ → SECOND
    DIRECTION

SECOND
DIRECTION
FIRST ──⊗
DIRECTION

METHODS OF MANUFACTURING SEMICONDUCTOR DEVICES

CROSS-REFERENCE TO RELATED APPLICATION

This application claims priority under 35 U.S.C. §119 to Korean Patent Application No. 10-2013-0151453, filed on Dec. 6, 2013 in the Korean Intellectual Property Office (KIPO), the disclosure of which is incorporated by reference herein in its entirety.

TECHNICAL FIELD

The present inventive concept relates to methods of manufacturing semiconductor devices.

DISCUSSION OF RELATED ART

Ion implantation processes are performed to form impurity regions for transistors using ion implantation masks. The ion implantation masks may have openings to define portions of a substrate to become impurity regions. Impurities are implanted through the openings into the portions of the substrate, preventing the impurities from being implanted into the other portions not exposed by the openings. Irregular or non-uniform shapes of ion implantation masks may cause transistors to be defective.

SUMMARY

According to an exemplary method of manufacturing a semiconductor device of the present inventive concept, a first protective layer, a mask layer, a second protective layer and a photoresist layer are sequentially formed on a substrate. A photoresist pattern is formed by partially removing the photoresist layer. An ion implantation mask is formed by sequentially etching the second protective layer, the mask layer and the first protective layer using the photoresist pattern. The ion implantation mask exposes the substrate. Impurities are implanted in an upper portion of the substrate exposed by the ion implantation mask.

According to an exemplary method of manufacturing a semiconductor device of the present inventive concept, a first gate structure and a second gate structure are formed on a substrate. A first ion implantation mask covering the second gate structure is formed. The first ion implantation mask includes a first protective layer pattern and a mask layer pattern. A first impurity region is formed in an upper portion of the substrate exposed by the first ion implantation mask. The first ion implantation mask is removed. A second ion implantation mask covering the first gate structure is formed. The second ion implantation mask includes a mask layer pattern. A second impurity region is formed in an upper portion of the substrate exposed by the second ion implantation mask.

According to an exemplary method of manufacturing a semiconductor device of the present inventive concept, first gate structures and second gate structures are formed on a substrate. The first gate structures are spaced apart at a first spacing from each other and the second gate structures are spaced apart at a second spacing from each other. A first ion implantation mask having a first opening is formed. The first ion implantation mask exposes the first gate structures through the first opening and covers the second gate structures. The first ion implantation mask includes a first protective layer pattern and a mask layer pattern. After the forming of the first ion implantation mask, first impurity regions are formed by implanting a first impurity into the substrate using the first ion implantation mask. A second ion implantation mask having a second opening is formed. The second ion implantation mask exposes the second gate through the second opening and covers the first gate structures. The second ion implantation mask includes a photoresist pattern only. After the forming of the second ion implantation mask, second impurity regions are formed by implanting a second impurity into the substrate using the second ion implantation mask.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
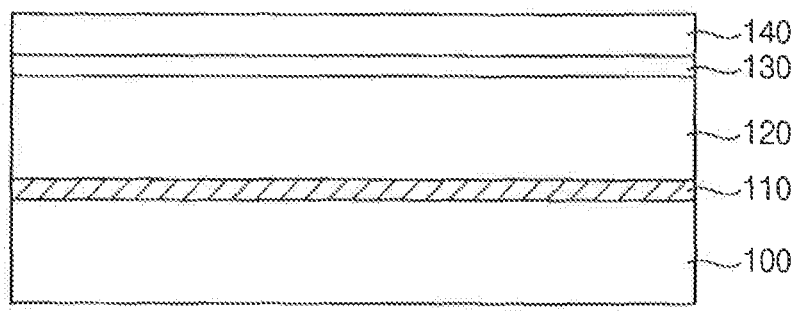
FIGS. 1 to 5 are cross-sectional views illustrating a method of forming an impurity region in accordance with an exemplary embodiment.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIGS. 1 to 5 are cross-sectional views illustrating a method of forming an impurity region in accordance with an exemplary embodiment.

Referring to FIG. 1, a first protective layer 110, a mask layer 120, a second protective layer 130 and a photoresist layer 140 are sequentially formed on a substrate 100.

The substrate 100 may include a semiconductor substrate, e.g., a silicon substrate, a germanium substrate, a silicon-germanium substrate, a silicon-on-insulator (SOI) substrate, a germanium-on-insulator (GOI) substrate, etc. A compound semiconductor may be used as the substrate 100. The compound semiconductor may be formed of groups III-V. The compound semiconductor substrate may include a GaP substrate, a GaAs substrate or a GaSb substrate, for example.

In an exemplary embodiment, structures including, e.g., an isolation layer defining an active region of the substrate 100, a gate structure, a spacer layer formed on the gate structure, etc., may be further formed on the substrate 100.

The first protective layer 110 may be formed of polysilicon. Alternatively, the first protective layer 110 may be formed of metal or metal nitride such as titanium (Ti), titanium nitride (TiN), tungsten (W), tungsten nitride (WN), or a combination thereof. The first protective layer may be formed by an atomic layer deposition (ALD) process, or a physical vapor deposition (PVD) process such as a sputtering process.

The mask layer 120 may include a hard mask material formed by a spin-on coating process (e.g., a spin-on hard mask (SOH) material). For example, the mask layer 120 may be formed using a carbon-based polymer or amorphous carbon.

The second protective layer 130 may be formed using silicon oxide (SiOx) or silicon oxynitride (SiON). The second protective layer 130 may be formed by a chemical vapor deposition (CVD) process, a plasma enhanced chemical vapor deposition (PECVD) process, a spin coating process, etc.

The photoresist layer 140 may be formed by coating a photosensitive composition on the second protective layer 130. For example, the photoresist layer 140 may be formed of a positive-type photosensitive composition of which an exposed portion may be dissolved and removed. A baking process may be further performed after coating the photosensitive composition to obtain the photoresist layer 140.

In an exemplary embodiment, the first protective layer 110 may have the smallest thickness among the first protective layer 110, the mask layer 120, the second protective layer 130 and the photoresist layer 140. In an exemplary embodiment, the mask layer 120 may have the greatest thickness.

Figure 2:
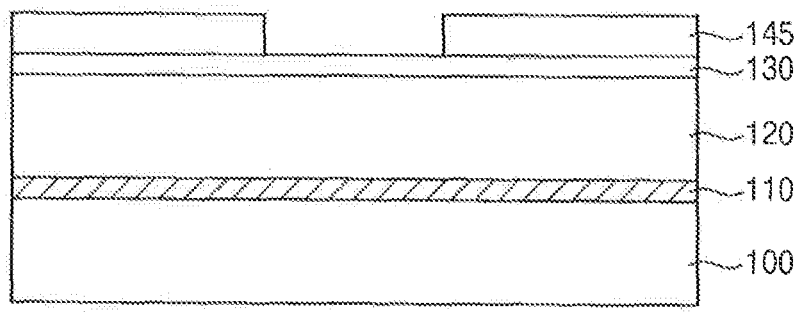

Referring to FIG. 2, the photoresist layer 140 is partially removed to form a photoresist pattern 145. In an exemplary embodiment, an exposure mask may be placed on the photoresist layer 140, and then an exposure process may be performed on the photoresist layer 140 using a light source such as EUV, ArF, an electron beam (EB). A developing process may be performed so that an exposed portion of the photoresist layer 140 may be removed to obtain the photoresist pattern 145. A baking process may be further performed after the developing process. The second protective layer 130 may serve as an anti-reflective layer during the exposure process.

Figure 3:
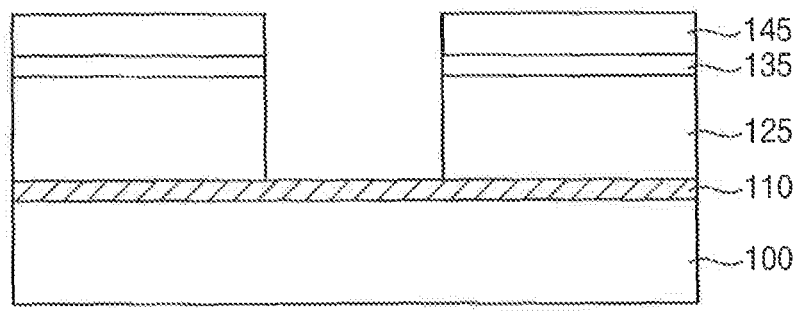

Referring to FIG. 3, a second protective layer pattern 135 and a mask layer pattern 125 are formed.

In an exemplary embodiment, the second protective layer 130 and the mask layer 120 may be partially removed by a dry etching process. The second protective layer 130 may be partially removed by a dry etching process using a fluorine-based gas, e.g., sulfur fluoride ($SF_6$), hydrogen fluoride (HF), bromine fluoride ($BrF_3$), ammonium fluoride ($NH_4F$) or nitrogen fluoride ($NF_3$) as an etching gas. These may be used alone or in a combination thereof. The mask layer 120 may be partially removed by a reactive ion etching (RIE) process using nitrogen ($N_2$) and/or oxygen ($O_2$) as an etching gas. In an exemplary embodiment, the second protective layer 130 and the mask layer 120 may be in-situ etched in the same process chamber by changing the etching gas.

As mentioned above, the mask layer 120 may have a relatively great thickness so that an etching amount of the mask layer 120 may be increased. Thus, the photoresist pattern 145 may be damaged while etching the mask layer 120. The second protective layer pattern 135 is formed between the photoresist pattern 145 and the mask layer 120 so that a loss or a damage of the photoresist pattern 145 may be compensated. Thus, the mask layer pattern 125 may have a uniform sidewall profile along its depth direction.

Figure 4A:
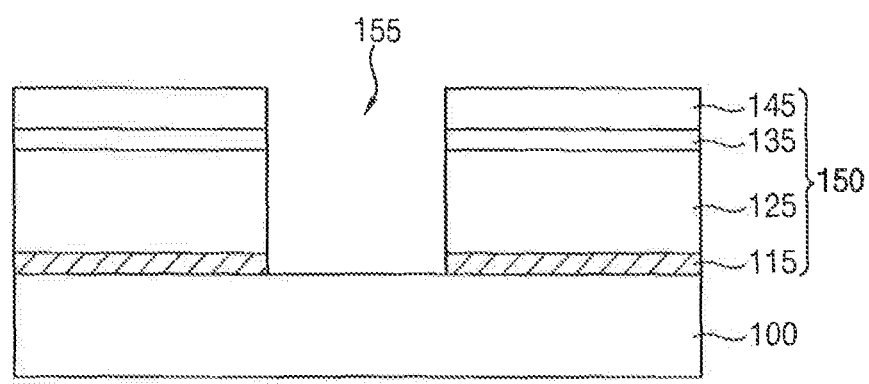

Referring to FIG. 4A, a first protective layer pattern 115 is formed. For example, the first protective layer 110 may be partially removed by a wet etching process using the mask layer pattern 125 as an etch mask. The wet etching process may include an etchant solution for removing a portion of the first protective layer 110 exposed by the mask layer pattern 125. For example, if the first protective layer 110 includes polysilicon, the etchant solution may include a hydroxyl group (—OH), such as ammonium hydroxide ($NH_4OH$), tetramethyl ammonium hydroxide (TMAH), tetraethyl ammonium hydroxide (TEAH), sodium hydroxide (NaOH), potassium hydroxide (KOH), etc. These may be used alone or in a combination thereof.

If the first protective layer 110 includes metal or metal nitride, the etchant solution including hydrogen peroxide ($H_2O_2$) or a combination of hydrogen peroxide and an acid component, e.g., nitric acid, sulfuric acid or chloric acid may be used.

Alternatively, the first protective layer may be partially removed by a dry etching process using $SF_6$, HF, $NF_3$, $Cl_2$ or HBr as the etching gas. These may be used alone or in a combination thereof.

After the formation of the first protective layer pattern 115, the substrate 100 is exposed by a preliminary ion implantation mask 150 through an opening 155. The preliminary ion implantation mask 150 includes the first protective layer pattern 115, the mask layer pattern 125, the second protective layer pattern 135 and the photoresist pattern 145 sequentially stacked on the substrate 100. The impurities may be implanted in a subsequent process into the exposed surface of the substrate 100 through the opening 155.

Figure 4B:
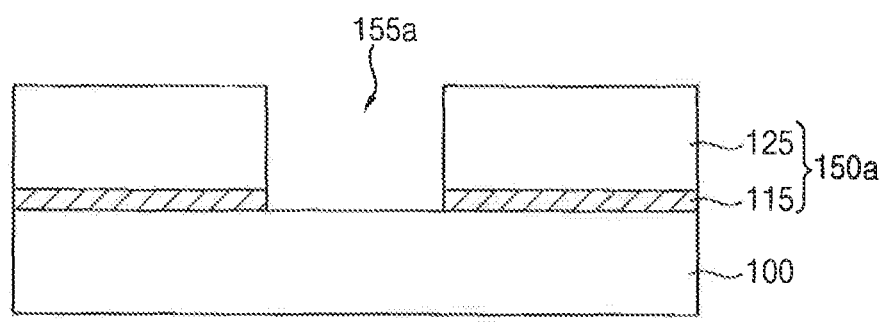

Referring to FIG. 4B, an ion implantation mask 150a is formed. The ion implantation mask 150a includes the first protective layer pattern 115 and the mask layer pattern 125. In this case, the photoresist pattern 145 and the first protective layer 110 are removed. For example, the photoresist pattern 145 may be removed by, for example, an ashing process and/or a strip process before etching the first protective layer 110, and then the first protective layer 110 may be partially removed by the dry etching process using the above-mentioned etching gas to form the first protective layer pattern 115. In an exemplary embodiment, the second protective layer pattern 135 may be removed together with the first protective layer 110. Additionally, a native oxide layer formed on the first protective layer pattern 115 may be removed in the dry etching process. The etching gas may include fluorine-based gases such as $SF_6$, HF, $NH_4F$ or $NF_3$. Accordingly, the ion implantation mask 150a including the first protective layer pattern 115 and the mask layer pattern 125 is completed, and an opening 155a exposing the portion of the substrate 100 is defined by the ion implantation mask 150a.

Figure 5:
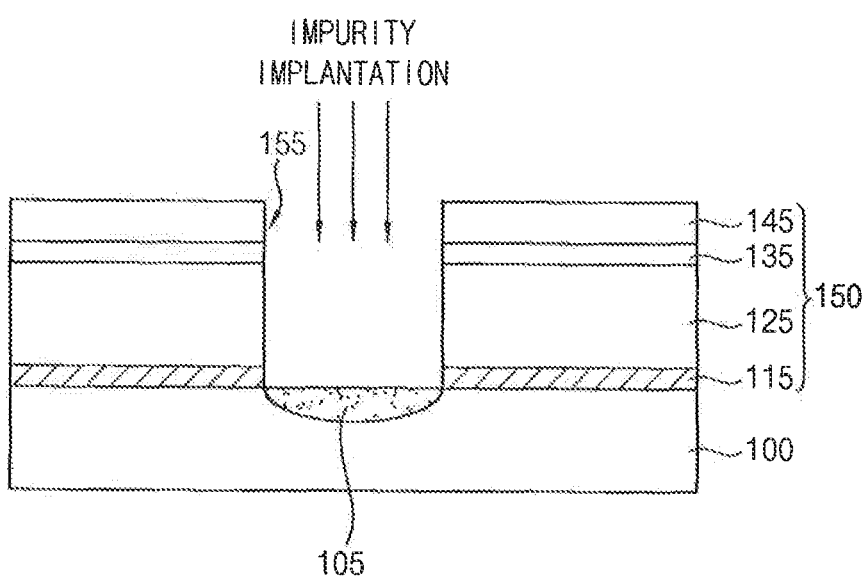

Referring to FIG. 5, impurities are implanted using the ion implantation mask 150 to form an impurity region 105 at a predetermined region of an upper portion of the substrate 100. For example, if the exposed region of the substrate 100 is an N-channel metal oxide semiconductor (NMOS) region, the impurities include n-type impurities such as phosphorous (P) or arsenic (As). If the exposed region of the substrate 100 is a P-channel metal oxide semiconductor (PMOS) region, the impurities include p-type impurities such as boron (B) or gallium (Ga).

According to an exemplary embodiment, the mask layer 120 may be patterned using the photoresist pattern 145 by the dry etching process, and then the first protective layer 110 may be selectively removed to form the ion implantation mask 150. In a case that the ion implantation mask is formed only using a photoresist layer, a sufficient exposure dose may not be provided into a lower portion of the photoresist layer. Thus, a lower portion of a photoresist pattern formed from the photoresist layer may be expanded to cause a photoresist tail (PR-tail). An impurity implantation may be blocked or interrupted by the PR-tail, and thus an impurity region having desired concentration, depth and dimension not be formed. If structures including a gate structure of a high aspect ratio and/or a fine pitch, or stepped portions are disposed on the substrate 100, the PR-tail may occur.

However, according to an exemplary embodiment, the photoresist pattern 145 may be used as an etching mask for pattering the second protective layer 130 and the mask layer 120, and the dry-etched mask layer pattern 125 may serve as the ion implantation mask. The mask layer pattern 125 may have a uniform sidewall profile so that a uniformity of the impurity implantation may be increased. Further, the first protective layer 110 may be selectively removed after forming the mask layer pattern 125, so that the substrate 100 and/or the structures thereon may be prevented from, e.g., an etching damage.

Referring back to FIG. 2, the photoresist pattern 145 may be stripped by a rework process if the photoresist pattern 145 is misaligned due to process errors in an exposure process. The second protective layer 130 interposed between the photoresist pattern 145 and the mask layer 120 may serve to protect the mask layer 120 in the rework process.

Referring back to FIG. 4B, the photoresist pattern 145 and the second protective layer pattern 135 are removed from the preliminary ion implantation mask 150 before implanting impurities into the substrate. The height of the ion implantation mask 150a is smaller than that of the preliminary ion implantation mask 150a. Compared to when the preliminary ion implantation mask 150 is used as an implantation mask, the ion implantation mask 150a may give less standard deviation of a projection range (Rp) of the impurities. The projection range (Rp) may represent the average travel distance of a group of implanted into the substrate 100. Alternatively, the preliminary ion implantation mask 150 may be used as an implantation mask if the height of the implantation mask 150 is enough to create a uniform distribution of impurities implanted.

FIGS. 6 to 17 are cross-sectional views illustrating a method of manufacturing a semiconductor device in accordance with an exemplary embodiment. Detailed descriptions of elements, materials and/or processes that are substantially the same as or similar to those described with reference to FIGS. 1 to 5 are omitted.

Figure 6:
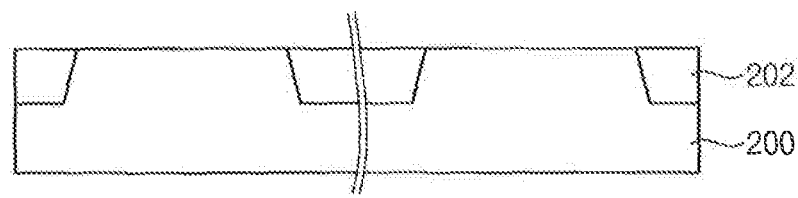
FIGS. 6 to 17 are cross-sectional views illustrating a method of manufacturing a semiconductor device in accordance with an exemplary embodiment.

Referring to FIG. 6, a substrate 200 includes a first region I and a second region II. In an exemplary embodiment, the first region I and the second region II may be provided as an NMOS region and a PMOS region, respectively. In this case, p-type impurities may be doped in the first region I to form a p-type well and n-type impurities may be doped in the second region II to form an n-type well. An isolation layer 202 may be formed by a shallow trench isolation (STI) process. The substrate 200 may be divided into an active region and a field region by the isolation layer 202.

Figure 7:
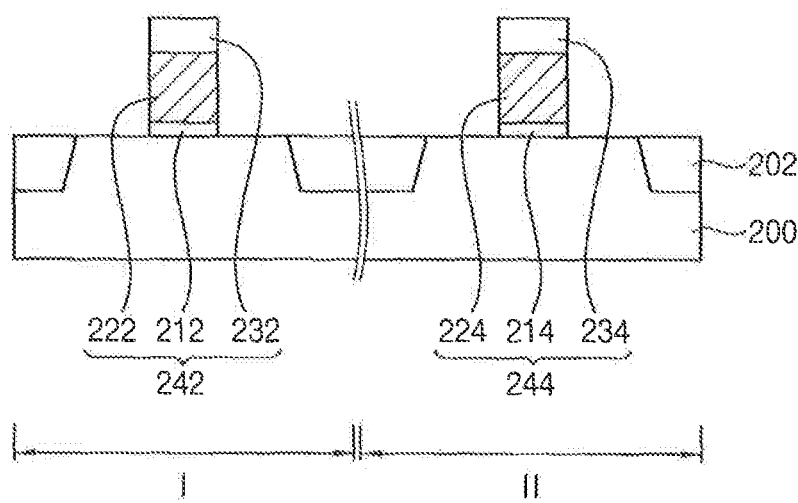

Referring to FIG. 7, a first gate structure 242 and a second gate structure 244 are formed on the first region I and the second region II of the substrate 200, respectively.

The first gate structure 242 includes a first gate insulation layer pattern 212, a first gate electrode 222 and a first gate mask 232, sequentially stacked on the first region I of the substrate 200. The second gate structure 244 includes a second gate insulation layer pattern 214, a second gate electrode 224 and a second gate mask 234, sequentially stacked on the second region II of the substrate 200.

In an exemplary embodiment, a gate insulation layer, a gate electrode layer and a gate mask layer may be sequentially formed on the substrate 200, and patterned using a photolithography process to form the first and second gate structures 242 and 244.

The gate insulation layer may include silicon oxide or metal oxide. For example, the gate insulation layer may be formed by performing a thermal oxidation process on a top surface of the substrate 200. The gate electrode layer may include doped polysilicon, metal, metal nitride or metal silicide. For example, the gate electrode layer may include molybdenum, titanium, tantalum, hafnium, zirconium, aluminum, tungsten, tantalum, tantalum silicide, tantalum aluminum, titanium silicide, titanium aluminum, molybdenum nitride, titanium nitride, tantalum nitride, hafnium nitride, zirconium nitride, aluminum nitride, tungsten nitride, tantalum silicide nitride, tantalum aluminum nitride, titanium silicide nitride, titanium aluminum nitride, or a combination thereof. The gate mask layer may include silicon nitride.

The gate insulation layer, the gate electrode layer and the gate mask layer may be formed using a CVD process, a PVD process or an ALD process. In an exemplary embodiment, the formation of the mask layer may be omitted. In this case, the gate structures 242 and 244 do not include the gate masks 232 and 234.

Figure 8:
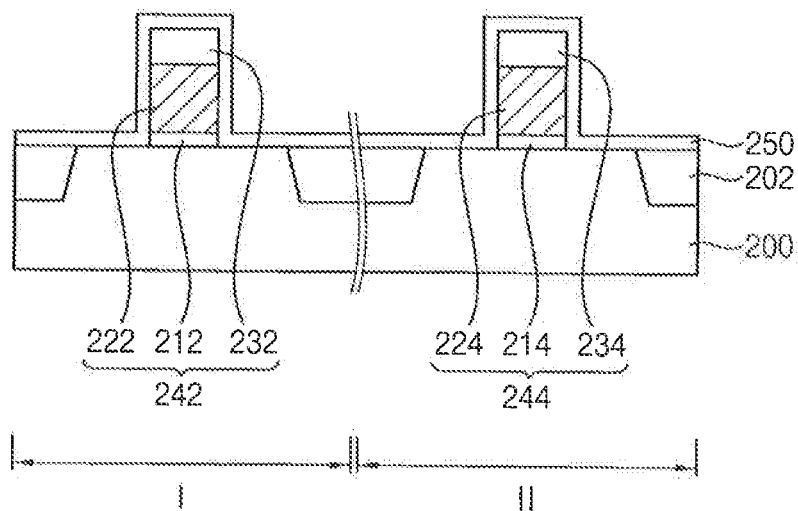

Referring to FIG. 8, a spacer layer 250 is formed on the resulting structure of FIG. 7. The spacer layer 250 is disposed on the first and second gate structures 242 and 244. The spacer layer 250 may include silicon nitride formed by a CVD process or a PECVD process.

Figure 9:
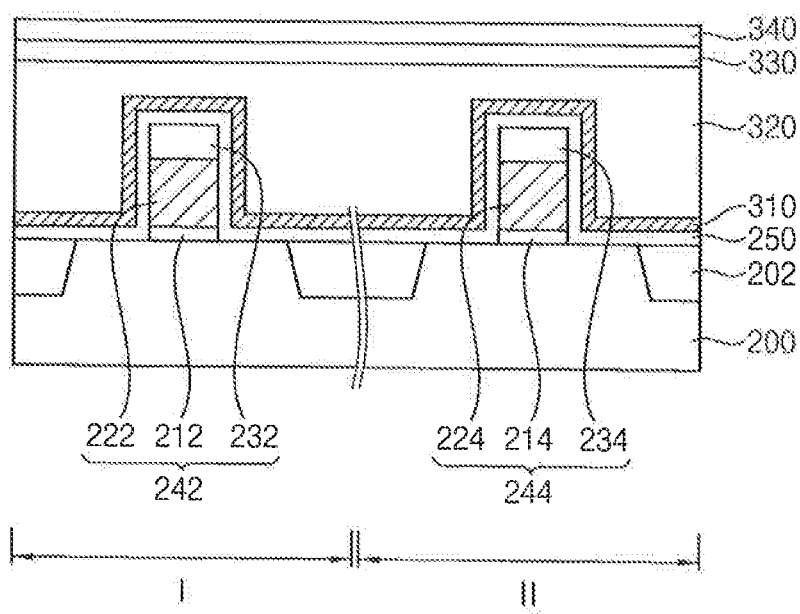

Referring to FIG. 9, a first protective layer 310, a mask layer 320, a second protective layer 330 and a photoresist layer 340 may be sequentially formed on the spacer layer 250. This process may be substantially the same as or similar to that described with reference to FIG. 1.

For example, the first protective layer 310 may be formed on substantially the entire surface of the spacer layer 250, and the mask layer 320 may completely cover the first and second gate structures 242 and 244.

Figure 10:
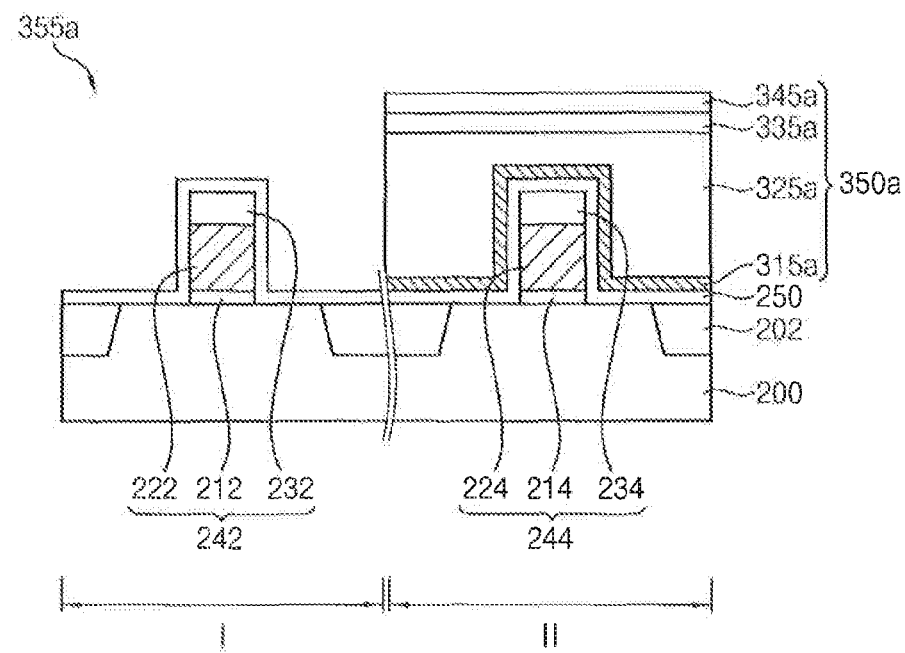

Referring to FIG. 10, portions of the photoresist layer 340, the second protective layer 330, the mask layer 320 and the first protective layer 310 formed on the first region I of the substrate 200 may be sequentially removed using processes that is substantially the same or similar to those described with reference to FIGS. 2 to 4A.

Accordingly, a first ion implantation mask 350a and a first opening 355a exposing the first region I of the substrate 200 may be formed. The first ion implantation mask 350a includes a first protective layer pattern 315a, a mask layer pattern 325a, a second protective layer pattern 335a and a photoresist pattern 345a that are sequentially stacked on the second region II of the substrate 200.

In an exemplary embodiment, the mask layer pattern 325a may be formed by a dry etching process, and then an exposed portion of the first protective layer 310 may be etched using an etchant solution or an etching gas that may have etching selectivity with respect to the spacer layer 250. Thus, the spacer layer 250 may remain after the mask layer pattern 325a is formed from the mask layer 320.

In an exemplary embodiment, the first ion implantation mask 350a may be formed of the first protective layer pattern 315a and the mask layer pattern 325a as shown in FIG. 4B. For example, the photoresist pattern 345a and the second protective layer pattern 335a may be removed such that the first ion implantation mask 350a may be formed of the first protective layer pattern 315a and the mask layer pattern 325a without including the photoresist pattern 345a and the second protective layer pattern 335a.

Figure 11:
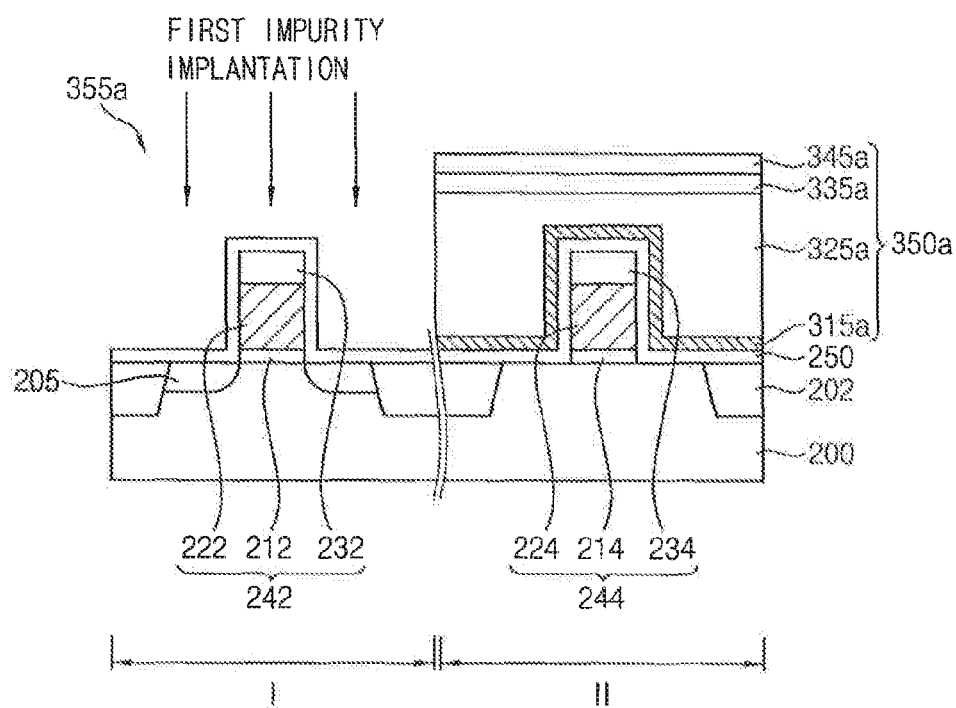

Referring to FIG. 11, a first impurity is implanted into an upper portion of the first region I of the substrate 200 using the first ion implantation mask 350a. Accordingly, a first impurity region 205 is formed at the upper portion of the substrate 200 adjacent to the first gate structure 242. As described above, if the first region I is provided as the NMOS region, the first impurity may include n-type impurities such as P or As.

Figure 12:
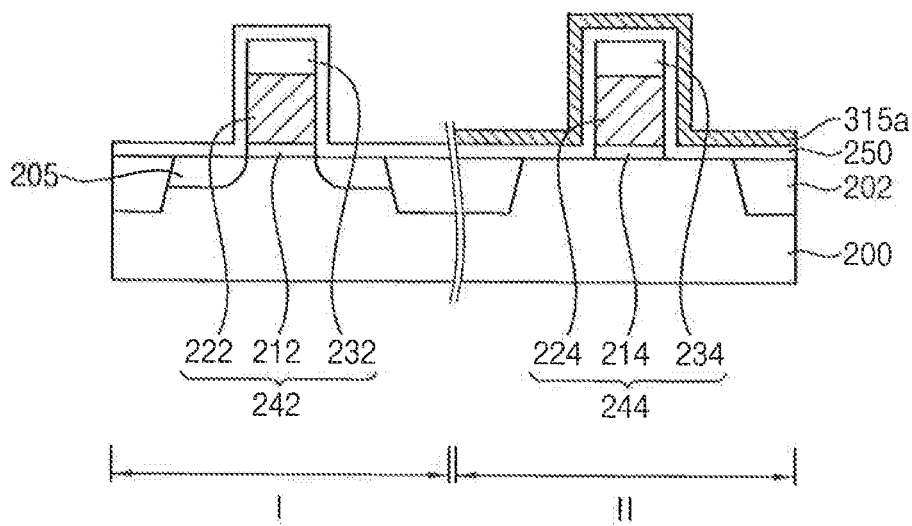

Referring to FIG. 12, the photoresist pattern 345a, the second protective layer pattern 335a and the mask layer pattern 325a formed on the second region II of the substrate 200 are removed using an ashing process and/a strip process, for example. The first protective layer pattern 315a remains on the second region II. Thus, the first protective layer pattern 315a may be used in a subsequent process for forming a second ion implantation mask 350b (see FIG. 14).

Figure 13:
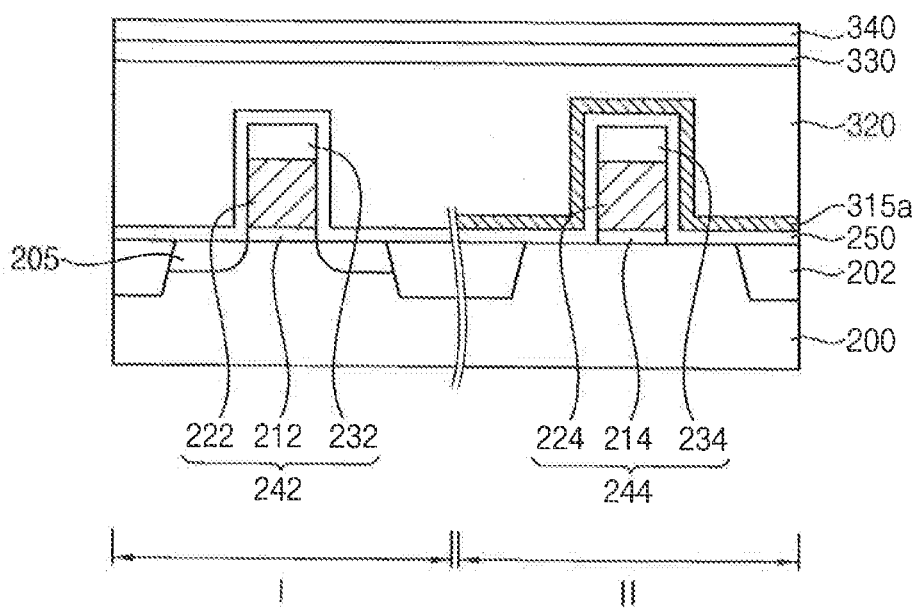

Referring to FIG. 13, the mask layer 320, the second protective layer 330 and the photoresist layer 340 covering the spacer layer 250 and the first protective layer pattern 315a are formed again on the substrate 200. Accordingly, the first region I of the substrate 200 is covered with the mask layer 320, the second protective layer 330 and the photoresist layer 340. For example, the mask layer 320, the second protective layer 330 and the photoresist layer 340 are formed on the spacer layer 250 that is disposed on the first region I of the substrate 200. The second region II of the substrate 200 is covered with the first protective layer pattern 315a, the mask layer 320, the second protective layer 330 and the photoresist layer 340. For example, the first protective layer pattern 315a, the mask layer 320, the second protective layer 330 and the photoresist layer 340 are formed on the spacer layer 250 disposed on the second region II of the substrate 200.

Figure 14:
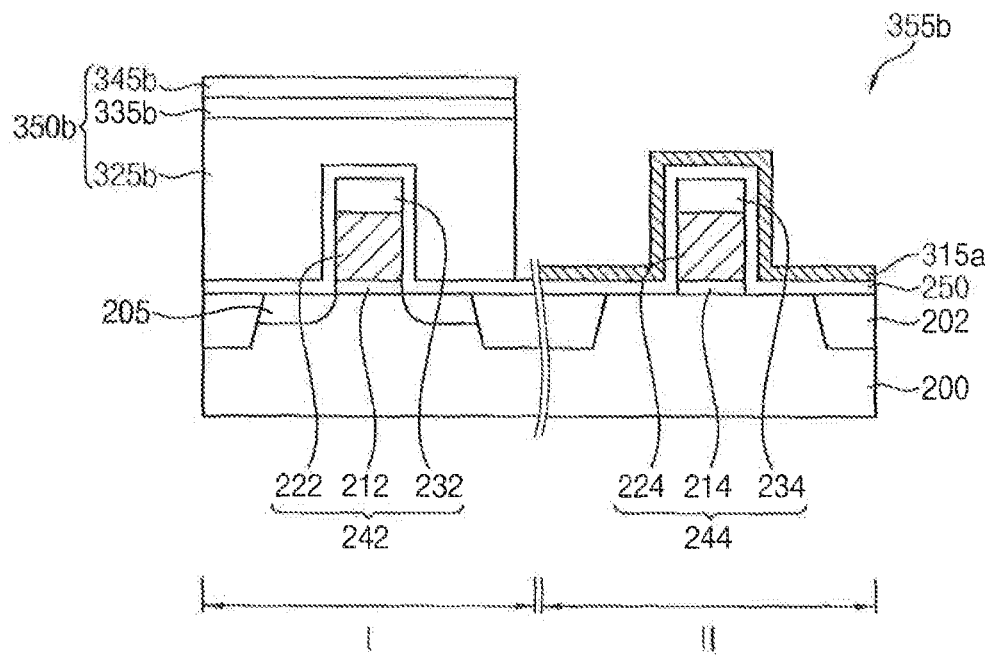

Referring to FIG. 14, processes substantially the same as or similar to those illustrated with reference to FIGS. 2 and 3 may be performed to remove portions of the photoresist layer 340, the second protective layer 330 and the mask layer 320 formed on the second region II of the substrate 200.

Accordingly, the second ion implantation mask 350b and a second opening 355b exposing the second region II of the substrate 200 are formed on the first region I of the substrate 200. In an exemplary embodiment, the second ion implantation mask 350b includes a mask layer pattern 325b, a second protective layer pattern 335b and a photoresist pattern 345b.

The second ion implantation mask 350b need not cover or overlap the first protective layer pattern 315a. If the second ion implantation mask 350b covers a portion of the first protective layer pattern 315a, the portion of the first protective layer pattern 315a may remain after performing a second impurity implantation (see FIG. 15) and removing the second ion implantation mask 350b. Thus, the second ion implantation mask 350b is formed only on the spacer layer 250 without covering the first protective layer pattern 315a.

Figure 15:
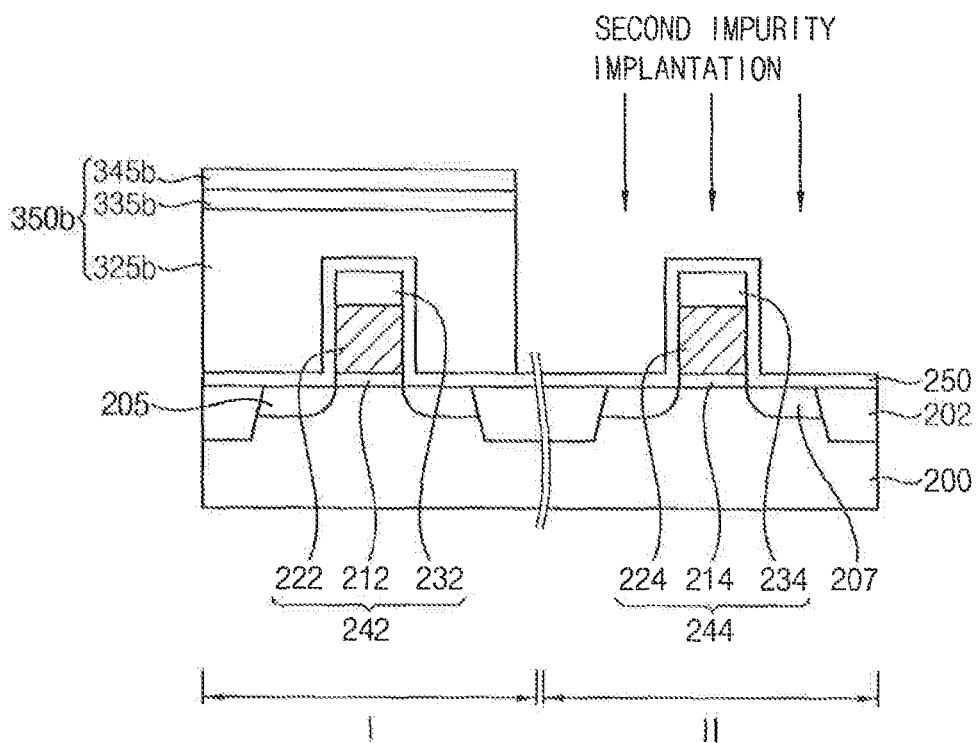

Referring to FIG. 15, a process substantially the same as or similar to that illustrated with reference to FIG. 4A may be performed to remove the first protective layer pattern 315a. As shown in FIG. 4B, the photoresist pattern 345b may be removed before removing the first protective layer pattern 315a and then the second protective layer pattern 335b may be removed while removing the first protective layer pattern 315a. In this case, the second ion implantation mask 350b may be formed of the mask layer pattern 325b only.

A second impurity is implanted in an upper portion of the second region II of the substrate 200 using the second ion implantation mask 350b. Accordingly, a second impurity region 207 is formed in the upper portion of the substrate adjacent to the second gate structure 244. As described above, if the second region II is provided as the PMOS region, the second impurity may include p-type impurities such as B or Ga.

By the formation of the first and second impurity regions 205 and 207, a complementary metal-oxide semiconductor (CMOS) transistor structure may be formed on the substrate 200. The CMOS transistor structure includes an NMOS transistor and a PMOS transistor form on the first region and the second region, respectively.

For example, the first impurity implantation may be formed in the NMOS region, and then the second impurity implantation may be formed in the PMOS region as described above. A first ion implantation mask exposing the PMOS region may be formed to perform a first impurity implantation, and then a second ion implantation mask exposing the NMOS region may be formed to perform a second impurity implantation.

Figure 16:
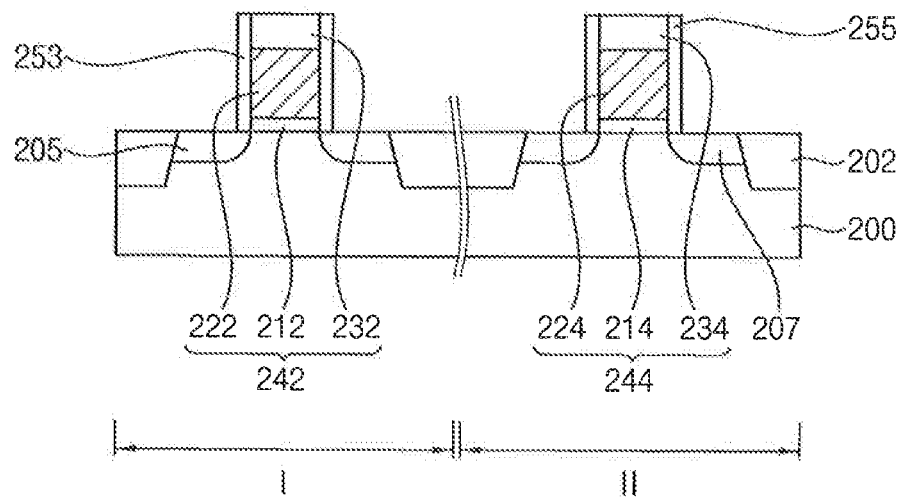

Referring to FIG. 16, the second ion implantation mask 350b is removed by an ashing and/or a strip process. The spacer layer 250 is partially removed by an etch-back process or an anisotropic etching process to form a first gate spacer 253 and a second gate spacer 255 on sidewalls of the first gate structure 242 and the second gate structure 244, respectively. The first and second impurity regions 205 and 207 are exposed by the partial removal of the spacer layer 250.

Figure 17:
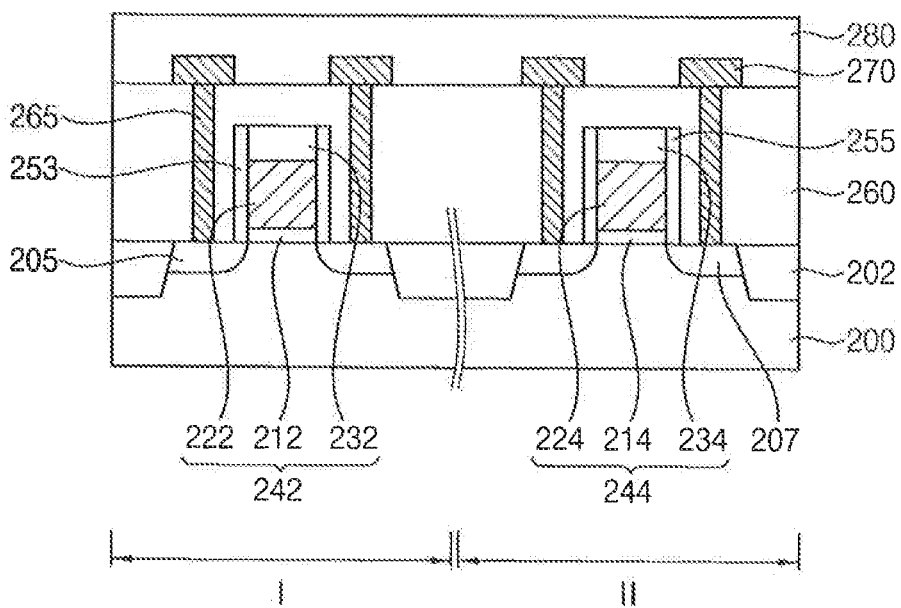

Referring to FIG. 17, a wiring structure is formed to complete the semiconductor device.

For example, a first insulating interlayer 260 covering the first and second gate structures 242 and 244 are formed on the substrate 200. The first insulating interlayer 260 may be formed using an insulation material such as silicon oxide by a CVD process, a PECVD process, or a spin coating process.

Plugs 265 penetrate the first insulating interlayer 260 to be in contact with the first and second impurity regions 205 and 207. For example, the first insulating interlayer 260 is partially removed such that contact holes are formed exposing the first and second impurity regions 205 and 207. A first conductive layer filling the contact holes is formed on the first insulating interlayer 260 and the impurity regions 205 and 207. The first conductive layer may be planarized to form the plugs 265.

A second conductive layer may be formed on the first insulating interlayer 260, and then the second conductive layer may be patterned to form wirings 270 electrically connected to plugs 265.

The first and second conductive layers may be formed using metal or metal nitride, e.g., titanium, titanium nitride, tungsten, tungsten nitride, aluminum, etc., by a sputtering process, a PVD process or an ALD process.

A second insulating interlayer 280 covering the wirings 270 is formed on the first insulating interlayer 260. The second insulating interlayer 280 may be formed using an insulation material such as silicon oxide by a CVD process, a PECVD process, a spin coating process.

Pads, and/or a memory unit may be formed to be electrically connected to the wirings 270.

FIGS. 18 to 30 are cross-sectional views illustrating a method of manufacturing a semiconductor device in accordance with an exemplary embodiment. Detailed descriptions on elements, materials and/or processes substantially the same as or similar to those illustrated with reference to FIGS. 1 to 5 and FIGS. 6 to 17 are omitted. Like reference numerals may refer to like elements.

Figure 18:
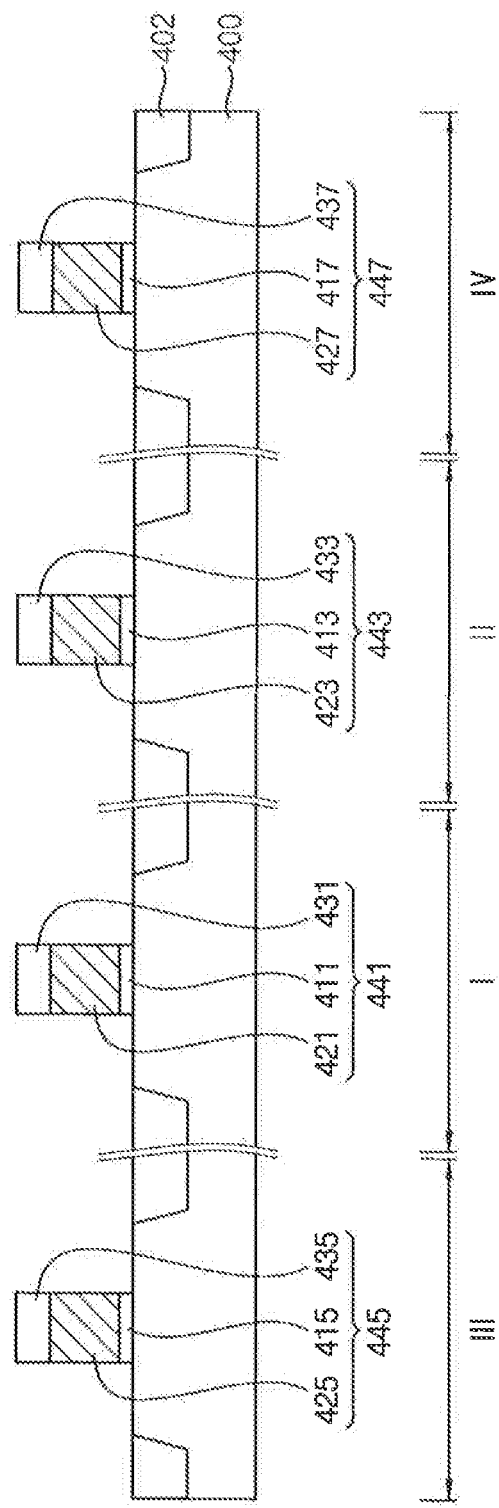
FIGS. 18 to 30 are cross-sectional views illustrating a method of manufacturing a semiconductor device in accordance with an exemplary embodiment.

Referring to FIG. 18, a substrate 400 including a first region I, a second region II, a third region III and a fourth region IV is prepared. The first and second regions I and II may serve as memory cell regions of the substrate 400. The third and fourth regions III and IV may serve as peripheral circuit regions of the substrate 400.

The first region I and the fourth region IV may include NMOS regions, and the second region II and the third region III may include PMOS regions. In this case, p-type wells may be formed at upper portions of the first and fourth regions I and IV, and n-type wells may be formed at upper portions of the second and third regions II and III. An isolation layer 402 may be formed on the substrate 400 by an STI process so that the substrate 400 may be divided into an active region and a field region.

A process substantially the same as or similar to that illustrated with reference to FIG. 7 may be performed to form a first gate structure 441, a second gate structure 443, a third gate structure 445 and a fourth gate structure 447 on the first region I, the second region II, the third region III and the fourth region IV, respectively. The first gate structure 441 includes a first gate insulation layer pattern 411, a first gate electrode 421 and a first gate mask 431 sequentially stacked on the substrate 400. Similarly, the second to fourth gate structures 443, 445 and 447 include second to fourth gate insulation layer patterns 413, 415 and 417, second to fourth gate electrodes 423, 425 and 427, and second to fourth gate masks 433, 435 and 437 sequentially stacked on the substrate 400.

The first region I and the second region II maybe adjacent to each other. For example, a distance between the first and second regions I and II may be smaller than a distance between other regions.

FIG. 18 illustrates that for the convenience of a description, one gate structure is formed on each of the first to fourth regions I, II, III and IV. However, more than one gate structures may be formed on each of the first to fourth regions I, II, III and IV. In this case, a pitch or a distance between the neighboring gate structures on the first and second regions I and II corresponding to the memory cell regions may be smaller than that on the third and fourth regions III and IV.

Figure 19:
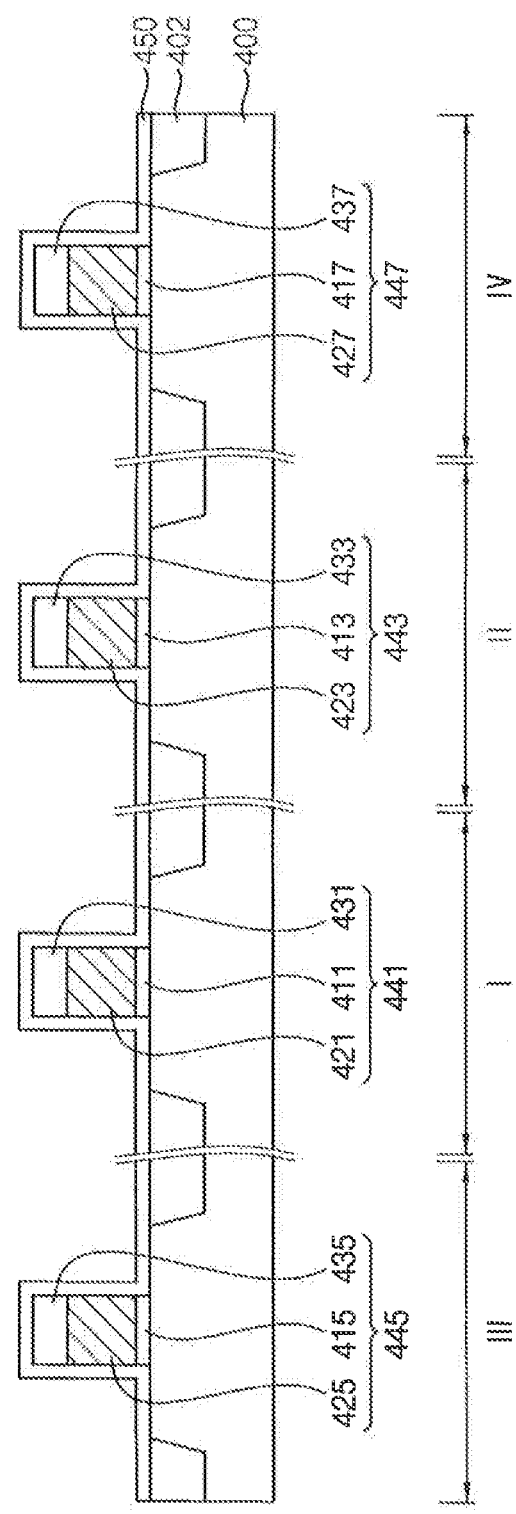

Referring to FIG. 19, a process substantially the same as or similar to that illustrated with reference to FIG. 8 may be performed to form a spacer layer 450 covering the gate structures 441, 443, 445 and 447 on the substrate 400.

Figure 20:
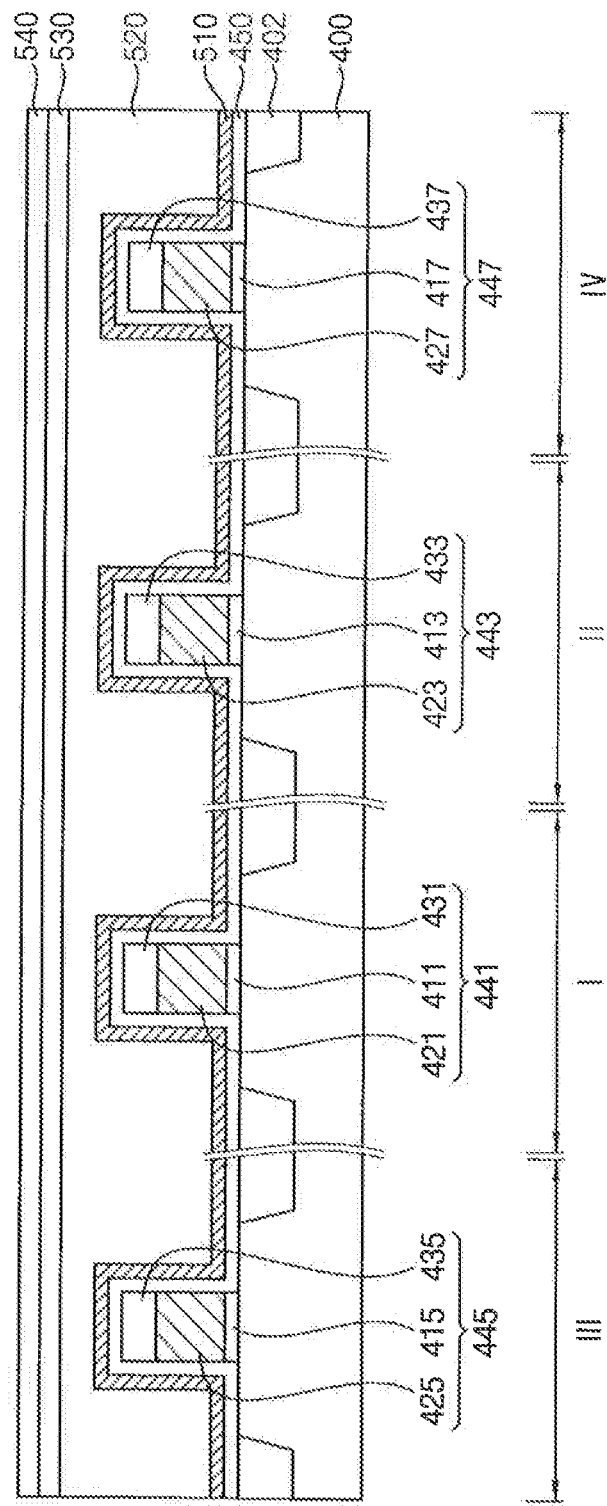

Referring to FIG. 20, a process substantially the same as or similar to that illustrated with reference to FIG. 1 or FIG. 9 may be performed. Accordingly, a first protective layer 510, a mask layer 520, a second protective layer 530 and a first photoresist layer 540 covering the gate structures 441, 443, 445 and 447 are formed on the spacer layer 450.

Figure 21:
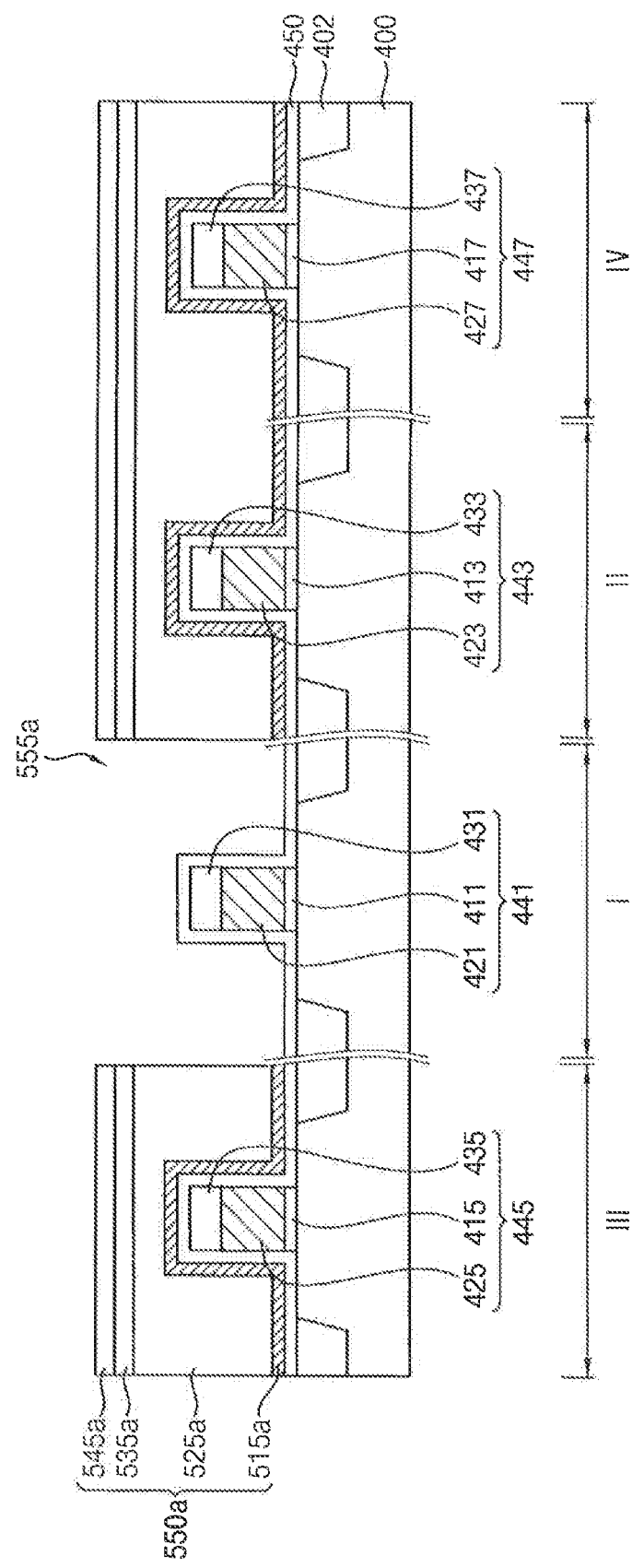

Referring to FIG. 21, processes substantially the same as or similar to those illustrated with reference to FIGS. 2 to 4A or FIG. 10 may be performed. Accordingly, a first ion implantation mask 550*a* and a first opening 555*a* exposing the first region I of the substrate 400 are formed. The first ion implantation mask 550*a* substantially covers the second, third and fourth regions II, III and IV, and includes a first protective layer pattern 515*a*, a mask layer pattern 525*a*, a second protective layer pattern 535*a* and a first photoresist pattern 545*a* sequentially stacked on the substrate 400.

As shown in FIG. 4B, the first photoresist pattern 545*a* and the second protective layer pattern 535*a* may be removed such that the first ion implantation mask 550*a* may be formed of the first protective layer pattern 515*a* and the mask layer pattern 525*a* only.

Figure 22:
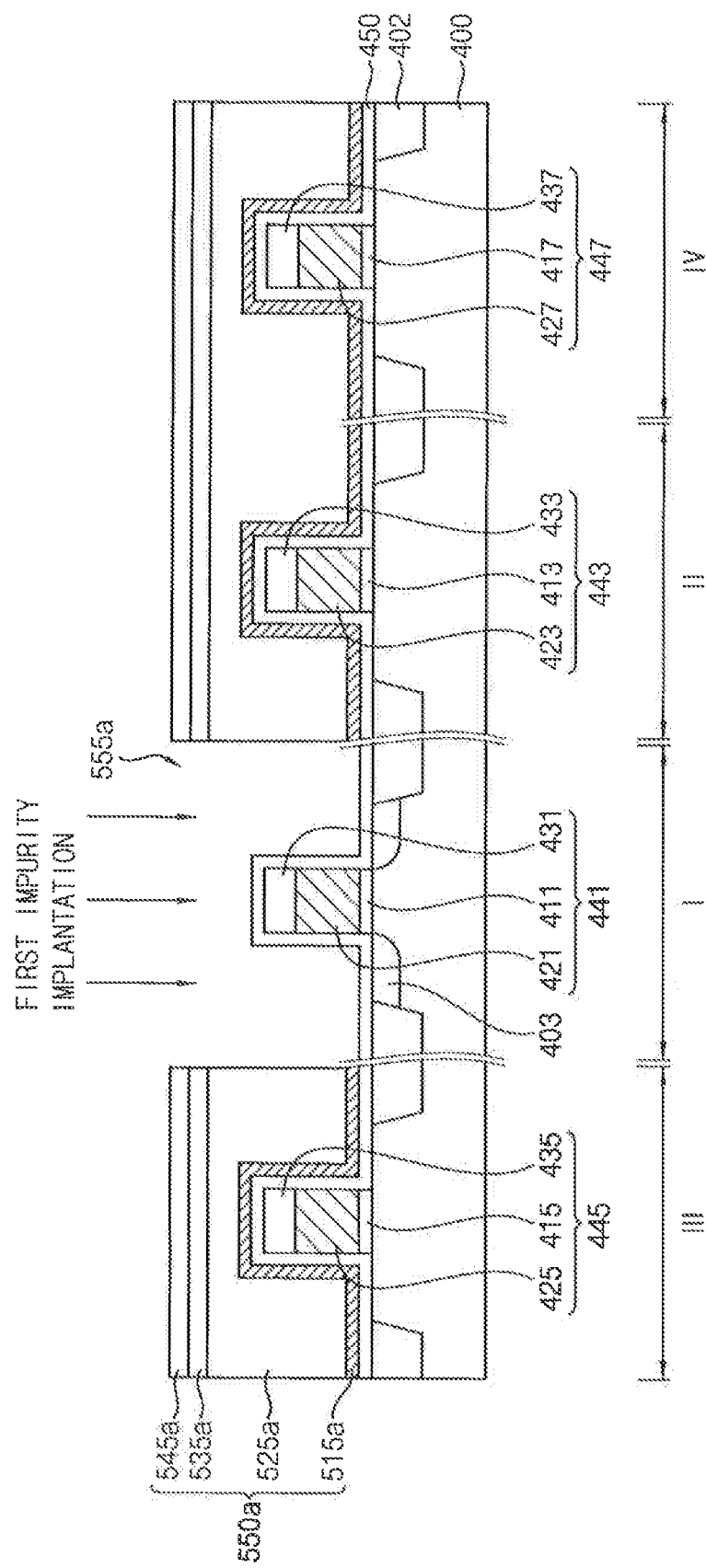

Referring to FIG. 22, a process substantially the same as or similar to that illustrated with reference to FIG. 11 may be performed. Accordingly, a first impurity is implanted into an upper portion of the first region I of the substrate 400 such that a first impurity region 403 is formed in the upper portion of the substrate 400 adjacent to the first gate structure 441. For example, the first impurity may include n-type impurities such as P or As.

Figure 23:
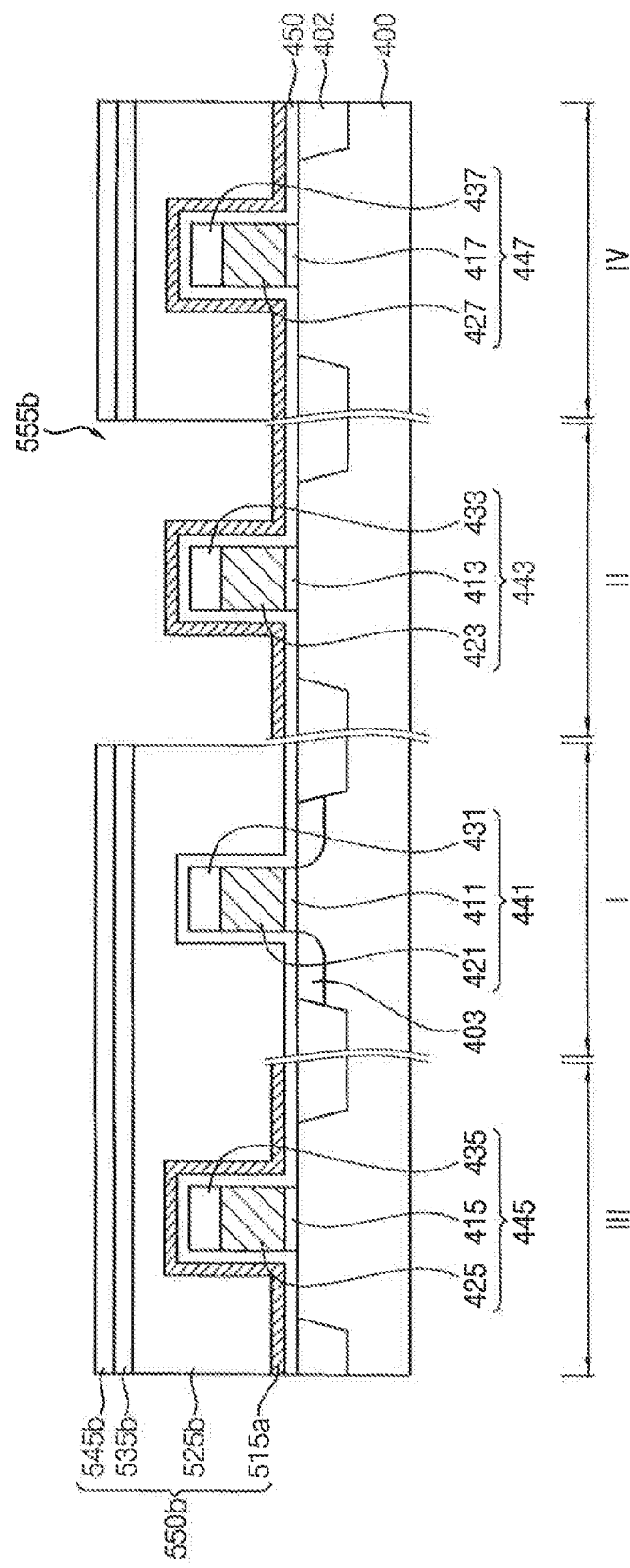

Referring to FIG. 23, processes substantially the same as or similar to those illustrated with reference to FIGS. 12 to 14 may be performed. For example, the first photoresist pattern 545*a*, the second protective layer pattern 535*a* and the mask layer pattern 525*a* may be removed by, e.g., an ashing process and/or a strip process. The mask layer, the second protective layer and the first photoresist layer may be formed again on the substrate 400, and partially etched to form a second ion implantation mask 550*b* and an opening 555*b* exposing the second region II of the substrate 400.

The second ion implantation mask 550*b* includes a multi-stacked structure including a mask layer pattern 525*b*, a second protective layer pattern 535*b* and a first photoresist pattern 545*b* on the first region I. The second ion implantation mask 550*b* includes a multi-stacked structure including the first protective layer pattern 515*a*, a mask layer pattern 525*b*, a second protective layer pattern 535*b* and a first photoresist pattern 545*b* on the third and fourth regions III and IV.

Figure 24:
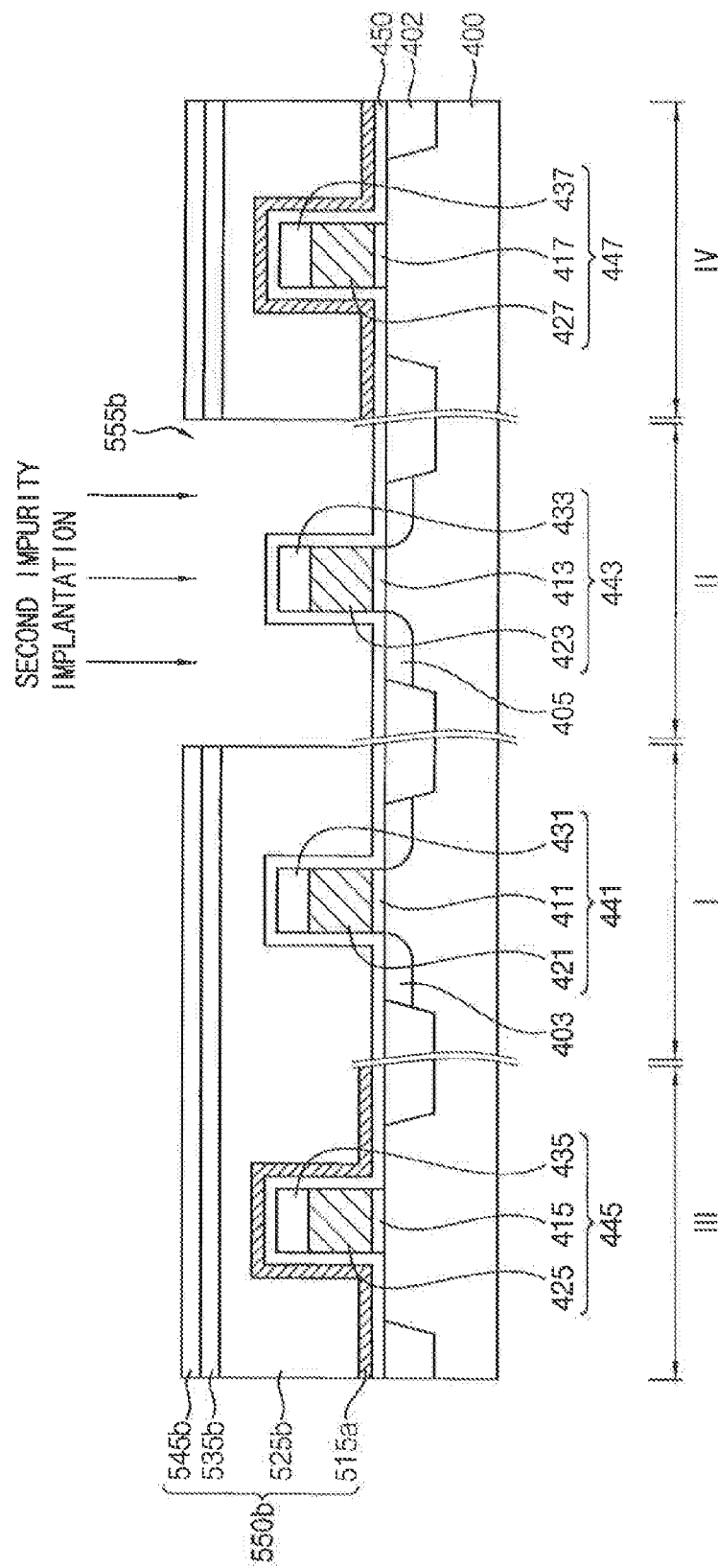

Referring to FIG. 24, a process substantially the same as or similar to that illustrated with reference to FIG. 15 may be performed. Accordingly, a portion of the first protective layer pattern 515*a* formed on the second region II of the substrate 400 is removed, and then a second impurity is implanted. Thus, a second impurity region 405 is formed in an upper portion of the substrate 400 adjacent to the second gate structure 443. In an exemplary embodiment, the second impurity may include p-type impurities such as B or Ga.

Figure 25:
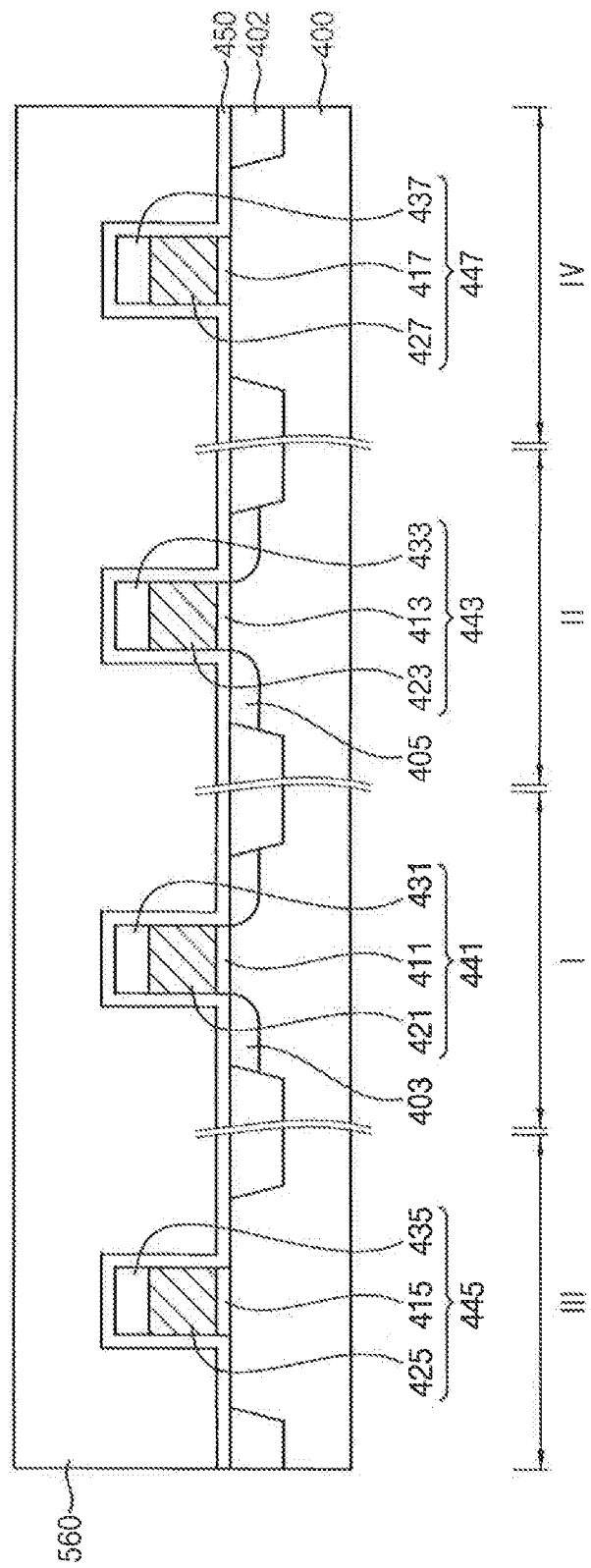

Referring to FIG. 25, the mask layer pattern 525*b*, the second protective layer pattern 535*h* and the first photoresist pattern 545*b* may be removed by an ashing process and/or a strip process, and the remaining first protective layer pattern 515*a* may be removed.

A second photoresist layer 560 covering the gate structures 441, 443, 445 and 447 is formed on the spacer layer 450.

Figure 26:
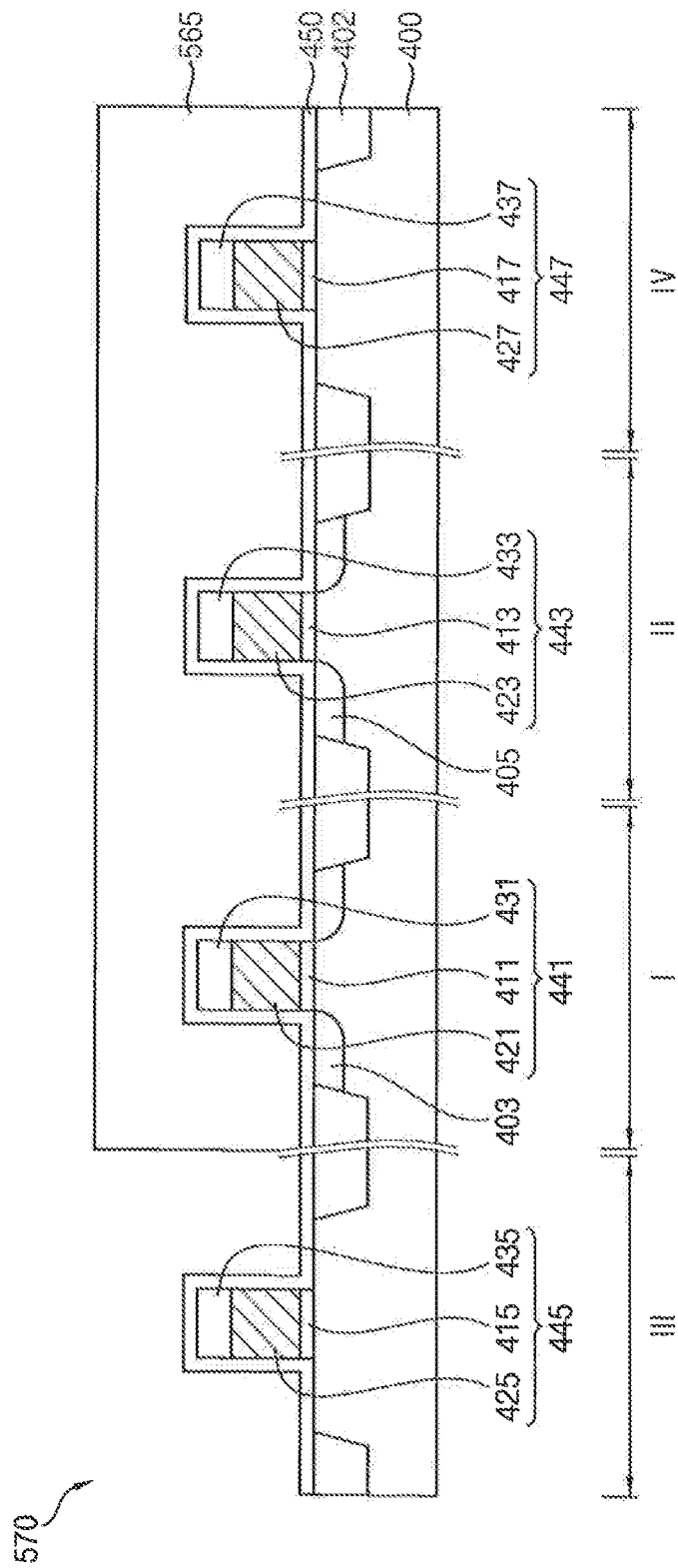

Referring to FIG. 26, exposure and developing processes may be performed to remove a portion of the second photoresist layer 560 formed on the third region III of the substrate 400. Accordingly, a second photoresist pattern 565 and a third opening 570 exposing the third region III of the substrate 400 are formed.

Figure 27:
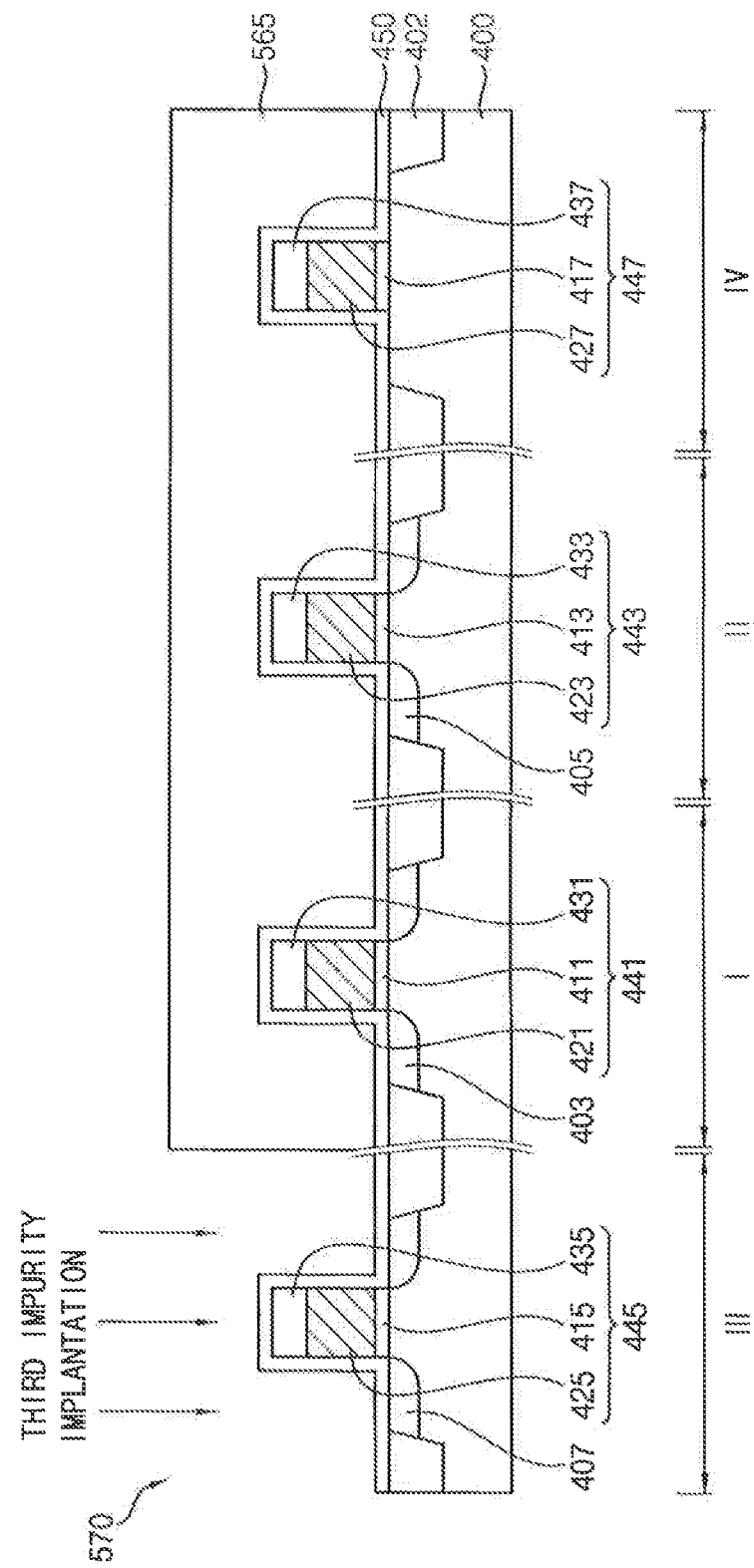

Referring to FIG. 27, a third impurity is implanted through the third opening 570 using the second photoresist pattern 565 as an ion implantation mask. Accordingly, a third impurity region 407 is formed in an upper portion of the third region III of the substrate 400 adjacent to the third gate structure 445. For example, the third impurity may include p-type impurities such as B or Ga.

Figure 28:
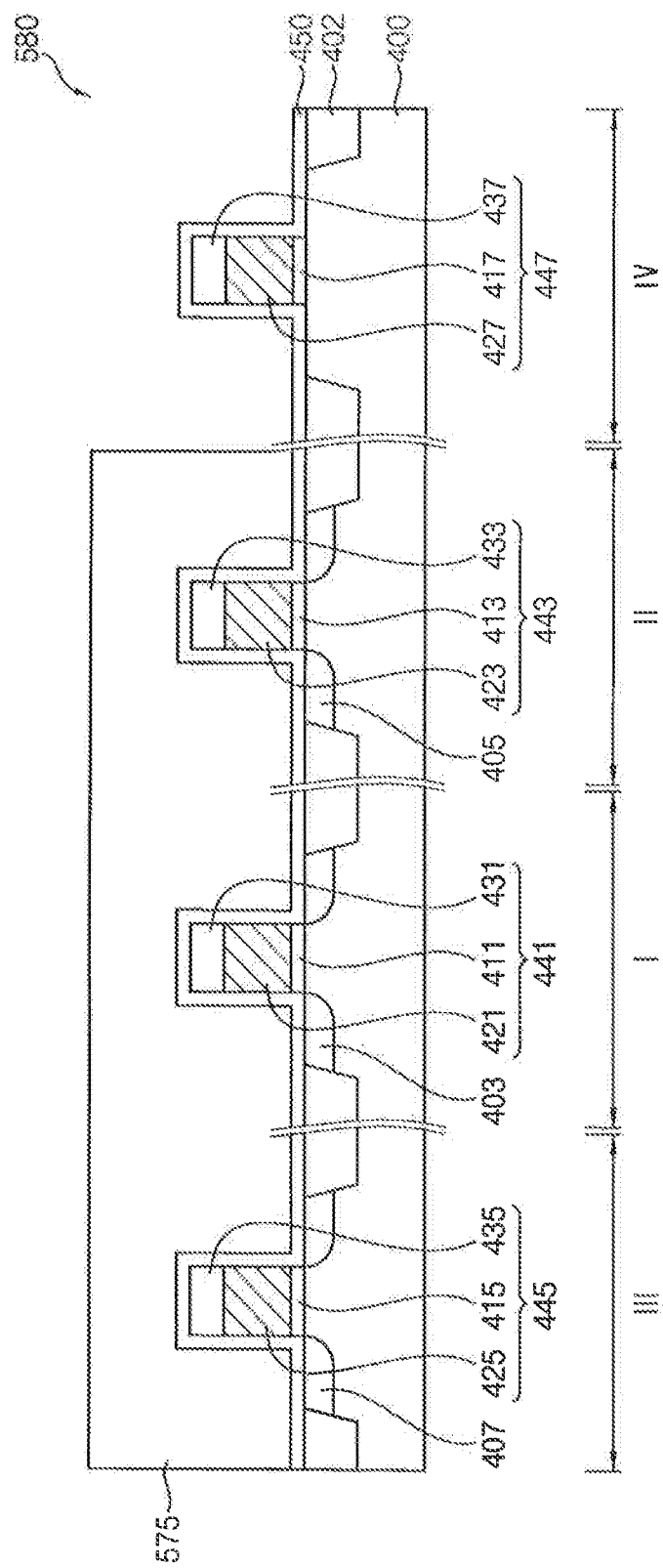

Referring to FIG. 28, the second photoresist pattern 565 may be removed by an ashing process and/or a strip process. A photoresist layer covering the gate structures 441, 443, 445 and 447 is formed again on the spacer layer 450. Exposure and developing processes may be performed to remove a portion of the photoresist layer formed on the fourth region IV of the substrate 400. Accordingly, a third photoresist pattern 575 and a fourth opening 580 exposing the fourth region IV of the substrate 400 are formed.

Figure 29:
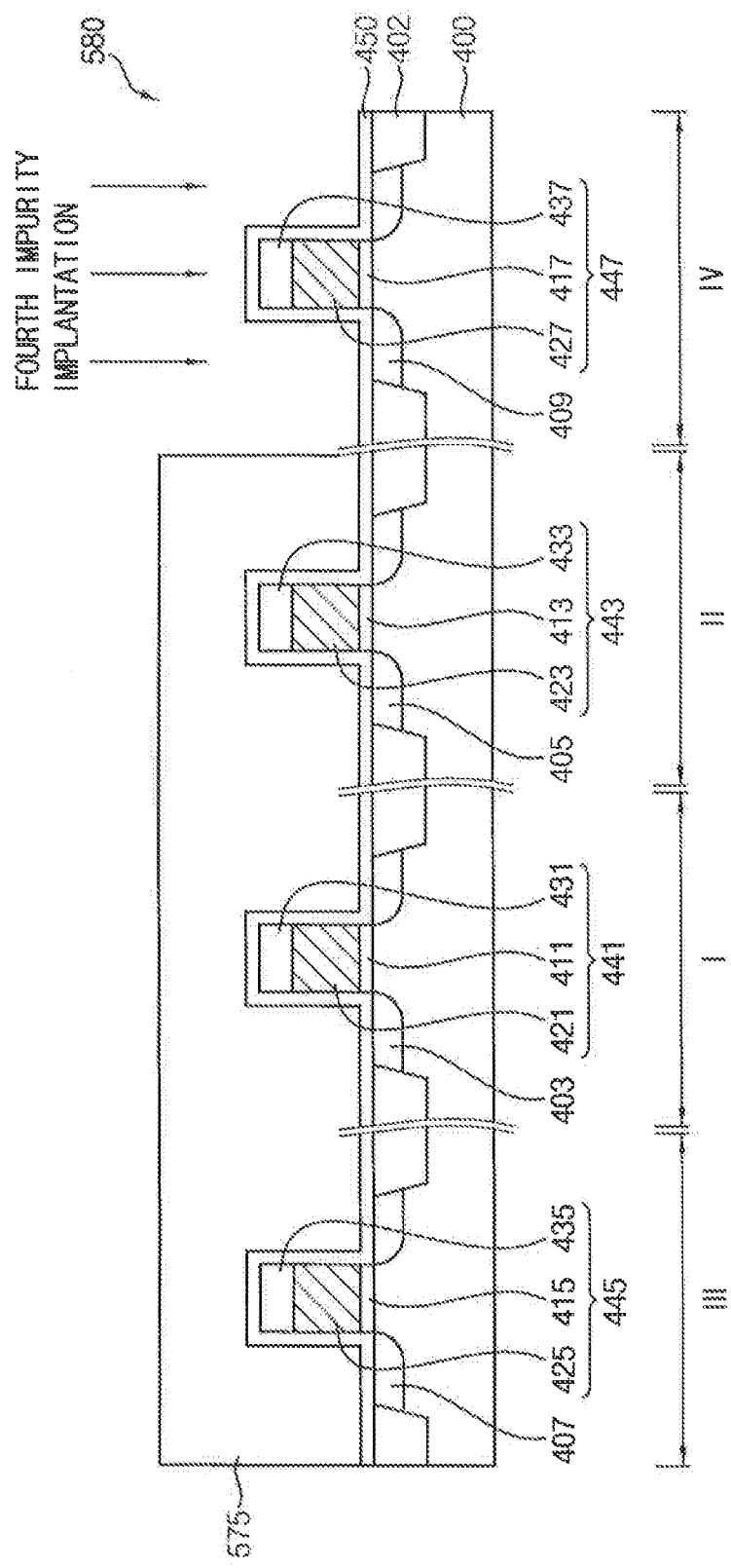

Referring to FIG. 29, a fourth impurity is implanted through the fourth opening 580 using the third photoresist pattern 575 as an ion implantation mask. Accordingly, a fourth impurity region 409 is formed in an upper portion of the fourth region IV of the substrate 400 adjacent to the fourth gate structure 447. For example, the fourth impurity may include n-type impurities such as P or As.

A transistor structure may be formed in each of the first to fourth regions I, II, III and IV by the formation of the impurity regions 403, 405, 407 and 409.

Figure 30:
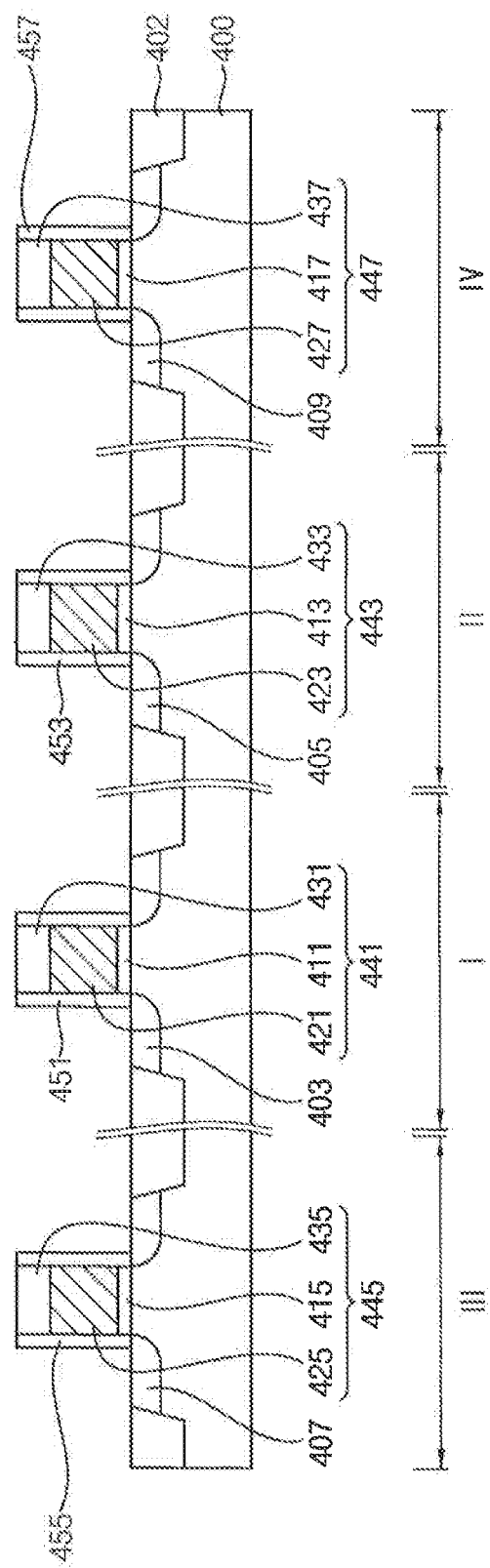

Referring to FIG. 30, a process substantially the same as or similar to that illustrated with reference to FIG. 16 may be performed. The third photoresist pattern 575 may be removed by an ashing process and/or a strip process. The spacer layer 450 is partially removed by an anisotropic etching process or an etch-back process. Accordingly, first to fourth spacers 451, 453, 455 and 457 are formed on sidewalls of the first to fourth gate structures 441, 443, 445 and 447.

A process substantially the same as or similar to that illustrated with reference to FIG. 17 may be performed. Accordingly, plugs electrically connected to the impurity regions 403, 405, 407 and 409 may be formed, and wirings electrically connected to the plugs may be formed.

The methods of forming impurity regions according to an exemplary embodiment may be applied to the first and second regions I and II corresponding to the memory cell regions and including the gate structures arranged by a relatively small distance or pitch. For example, as illustrated in FIGS. 1 to 5, a multi-layered ion implantation mask may serve to prevent the above-mentioned PR-tail and form the impurity region having a uniform concentration. A single-layered photoresist pattern may be used as an ion implantation mask on the third and fourth regions III and IV including the gate structures arranged by a relatively large distance or pitch to form the impurity region. Thus, process cost and time may be reduced.

In an exemplary embodiment, the impurity implantations using the multi-layered ion implantation mask may be performed consecutively, and the impurity implantations using the single-layered ion implantation mask may be also performed consecutively.

In a comparative example, n-type impurities implantations may be performed consecutively on the first region I and the fourth region IV, and then p-type impurities implantations may be performed consecutively on the second region II and the third region III. In this case, the multi-layered ion implantation masks and the single-layered ion implantation masks may be alternately and repeatedly formed. Thus, a complexity of process may be increased. Further, a formation and a removal of the first protective layer pattern 515a may be repeated, and thus the spacer layer 450 and the substrate 400 under the spacer layer 450 may be damaged.

However, according to an exemplary embodiment, the impurity implantations using the multi-layered ion implantation mask may be performed consecutively, and then the impurity implantations using the single-layered ion implantation mask may be performed consecutively. Therefore, an overall process may be simplified, and the damage of the spacer layer 450 and the substrate 400 may be prevented.

FIGS. 31 to 52 are top plan views and cross-sectional views illustrating a method of manufacturing a semiconductor device in accordance with an exemplary embodiment. Specifically, FIGS. 31, 34, 37, 40, 43, 46, 49 and 51 are top plan views of the semiconductor device. FIGS. 32, 35, 38, 41, 44, 47, 50 and 52 are cross-sectional views taken along line I-I' of FIG. 31, FIGS. 33, 36, 39, 42, 45 and 48 are cross-sectional views taken along line II-II' of FIG. 31.

Referring FIGS. 31 to 52, a method of manufacturing a semiconductor device including a fin field-effect transistor (FinFET) will be described. Detailed descriptions on processes, elements and/or materials substantially the same as or similar to those illustrated with reference to FIGS. 6 to 17 or FIGS. 18 to 30 are omitted.

Figure 31:
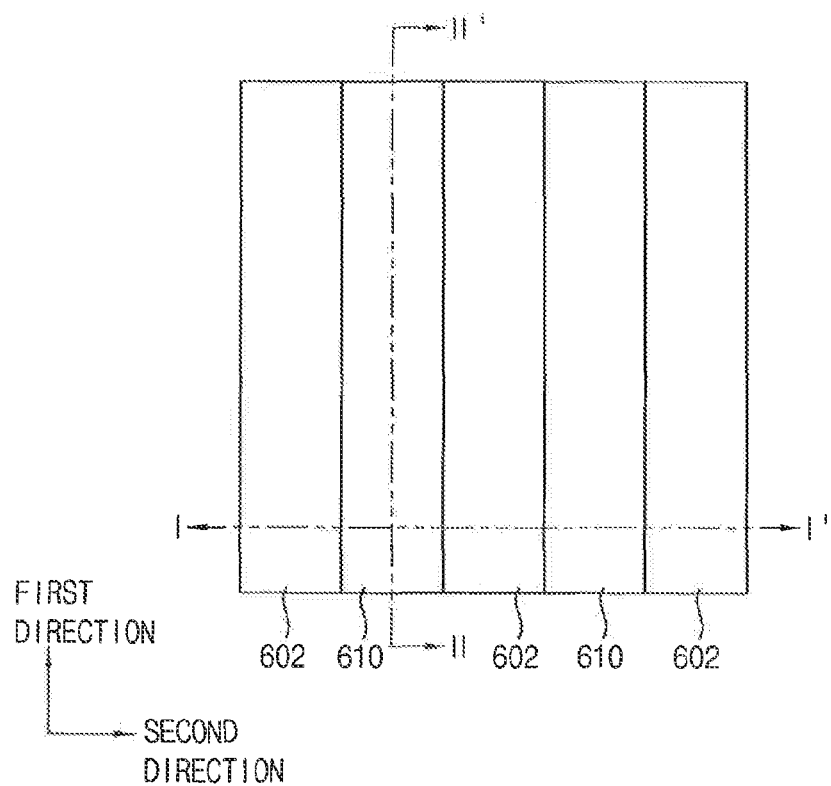
FIGS. 31 to 52 are top plan views and cross-sectional views illustrating a method of manufacturing a semiconductor device in accordance with an exemplary embodiment.
Figure 32:
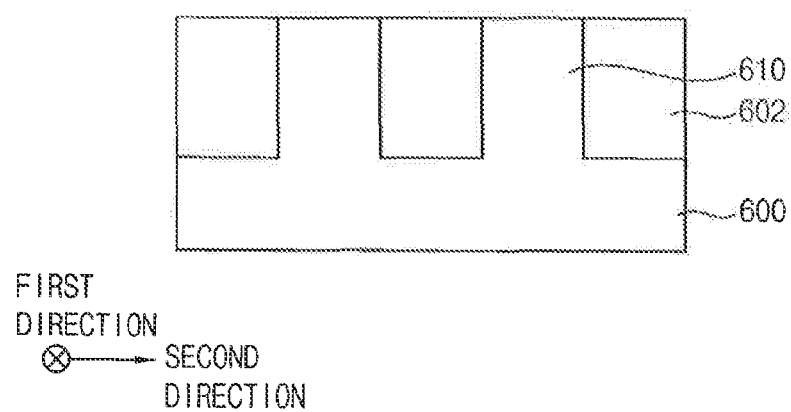
Figure 33:
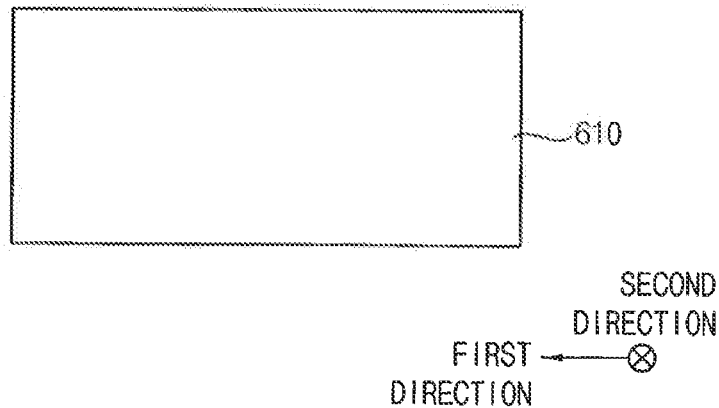

Referring to FIGS. 31 to 33, an isolation layer 602 is formed on a substrate 600 to define an active region 610. The isolation layer 602 may be formed by performing an STI process on an upper portion of the substrate 600.

The active region 610 extends in a first direction. The active regions 610 are defined by the isolation layer 602 and are arranged in a second direction substantially perpendicular to the first direction.

Figure 34:
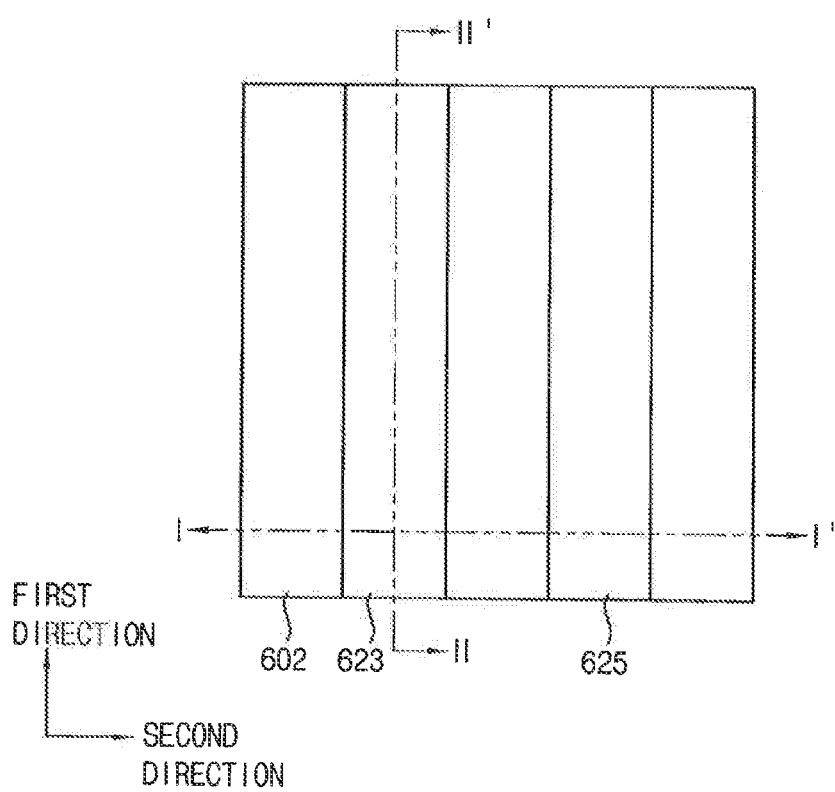
Figure 35:
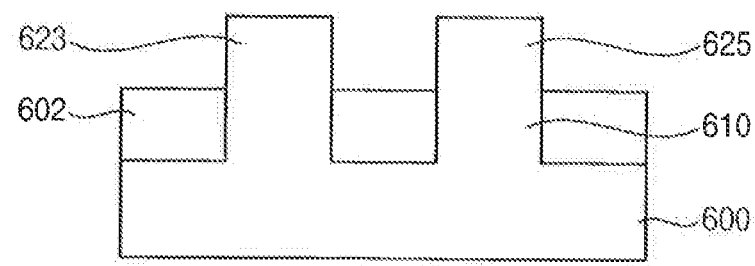
Figure 36:
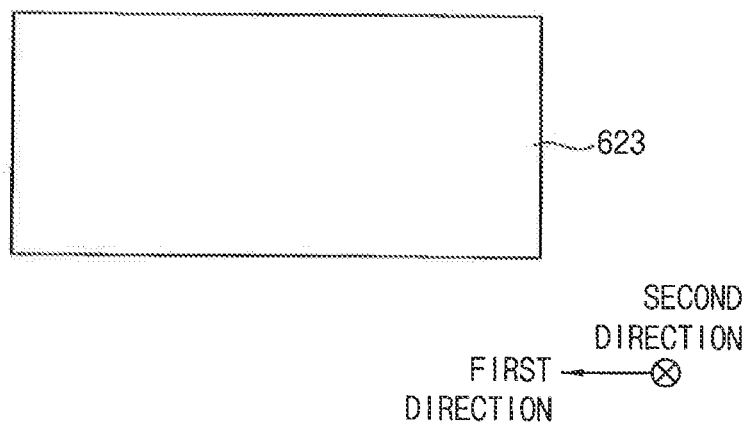

Referring to FIGS. 34 to 36, an upper portion of the isolation layer 602 is partially etched to expose an upper portion of the active region 610. Accordingly, a first semiconductor fin 623 and a second semiconductor fin 625 protruding from a top surface of the isolation layer 602 are formed. For the convenience of a description, FIG. 35 shows two semiconductor fins. At least three or more fins may be formed on the semiconductor.

Figure 37:
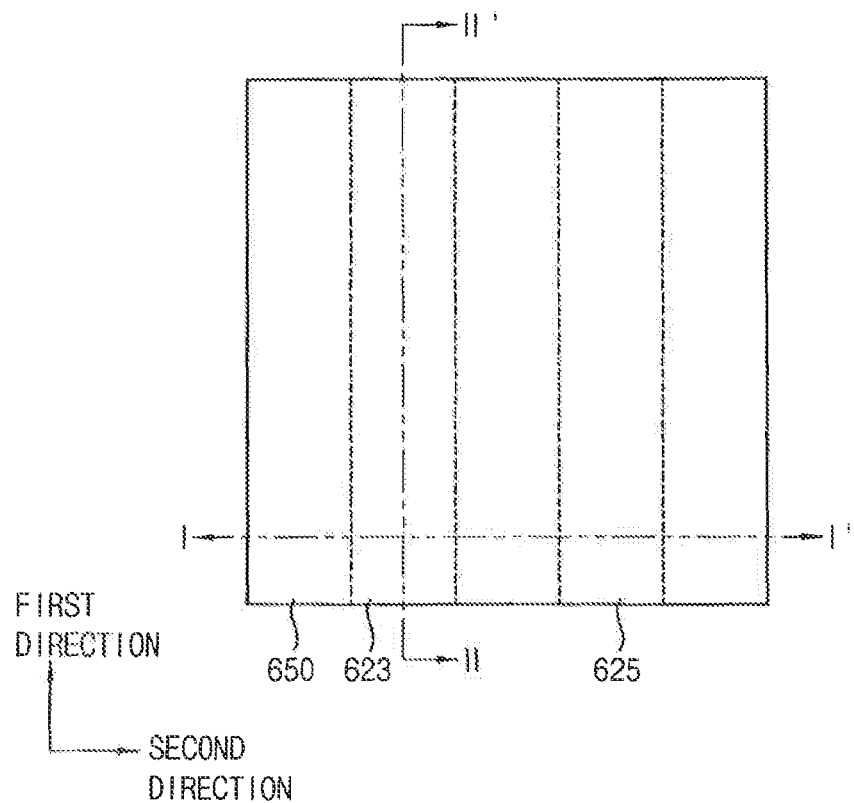
Figure 38:
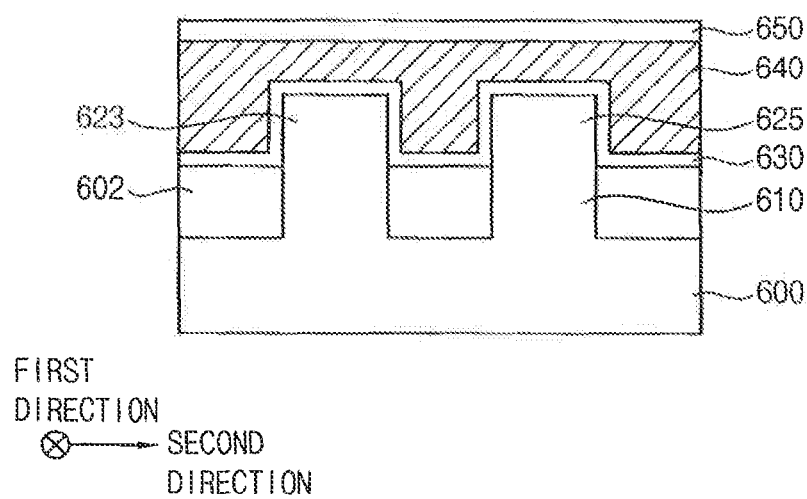
Figure 39:
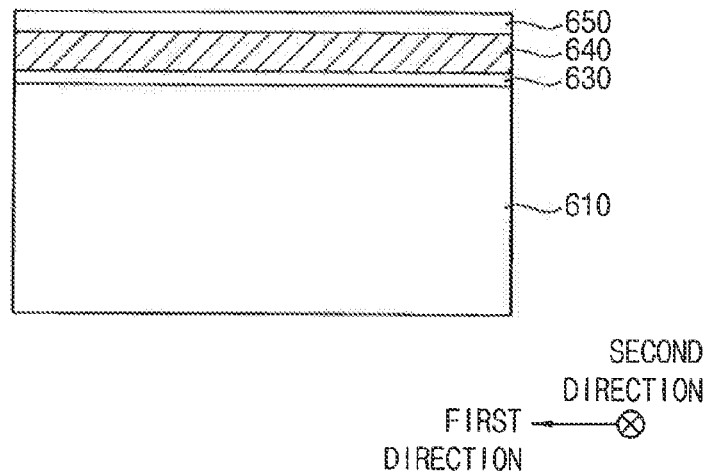

Referring to FIGS. 37 to 39, a gate insulation layer 630, a gate electrode layer 640 and a gate mask layer 650 are sequentially formed on the isolation layer 602 and semiconductor fins 623 and 625. The gate insulation layer 630 may be formed by performing a thermal oxidation process on the semiconductor fins 623 and 625. Alternatively, the gate insulation layer 630 may be formed by a deposition method such as a CVD process.

Figure 40:
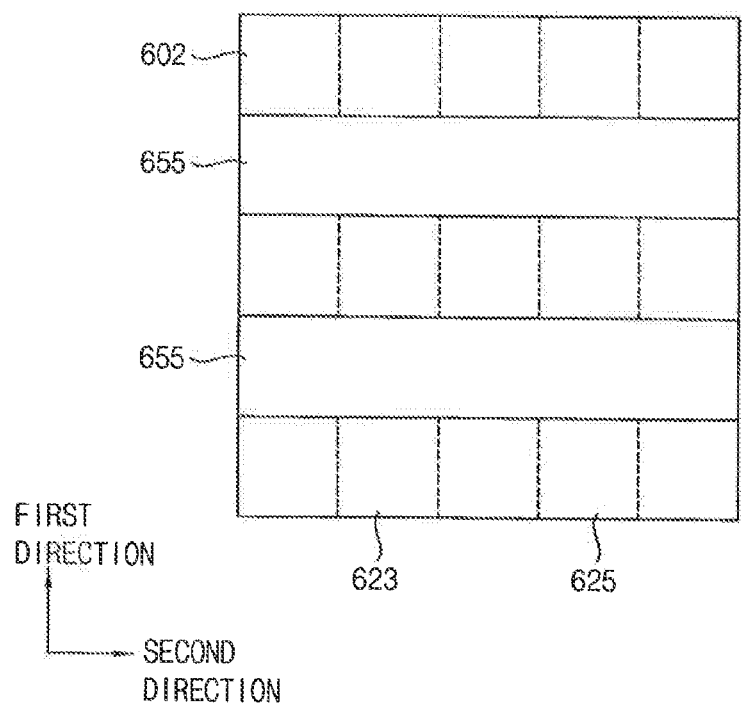
Figure 41:
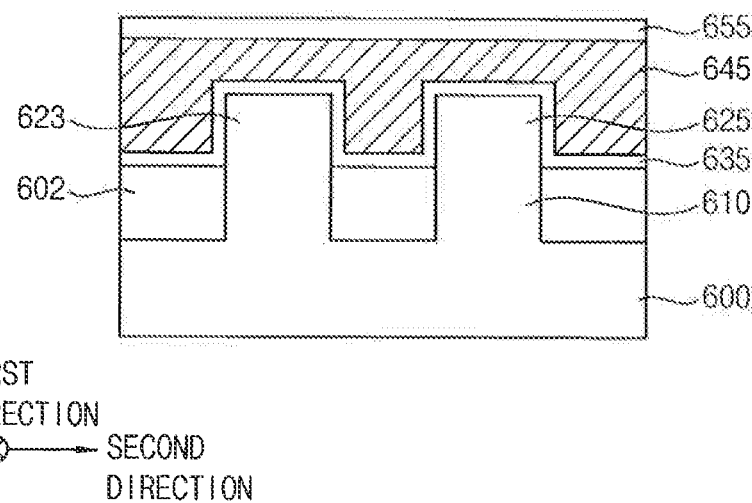
Figure 42:
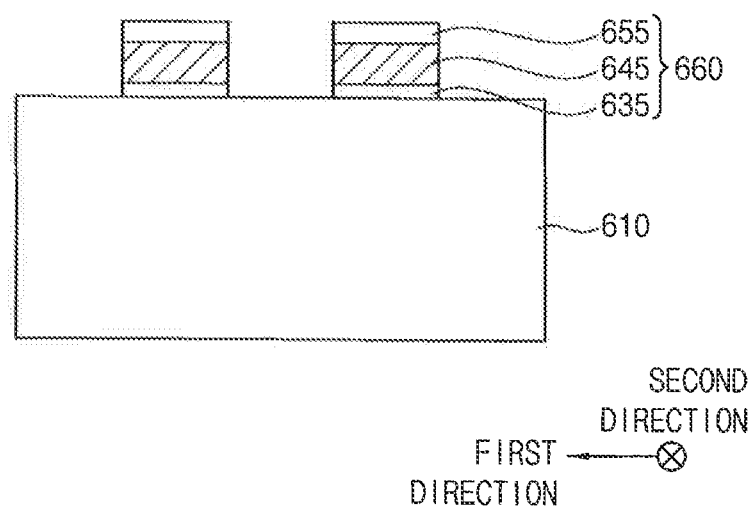

Referring to FIGS. 40 to 42, the gate mask layer 650, the gate electrode layer 640 and the gate insulation layer 630 are sequentially patterned to form a gate structure 660 on the active region 610. The gate structure 660 includes a gate insulation layer pattern 635, a gate electrode 645 and a gate mask 655 sequentially stacked on the semiconductor fins 623 and 625 of the active region 610.

The gate mask layer 650 may be patterned by, e.g., a photolithography process to form the gate mask 655. The gate electrode layer 640 and the gate insulation layer 630 are etched using the gate mask 655 to form the gate structure 660. The gate structure 660 extends in the second direction, and a plurality of the gate structures be formed in the first direction.

Figure 43:
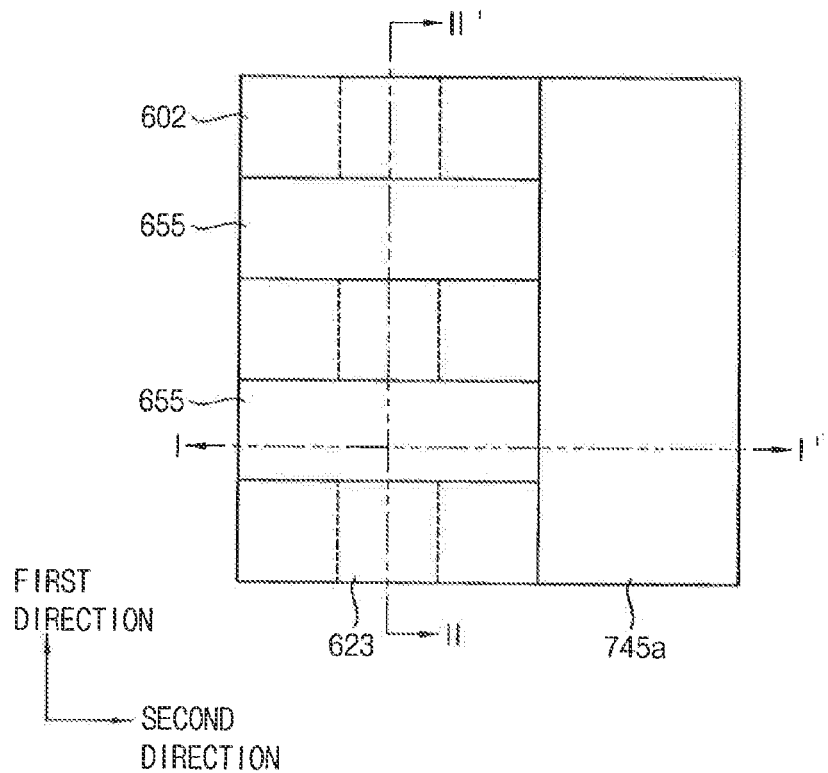
Figure 44:
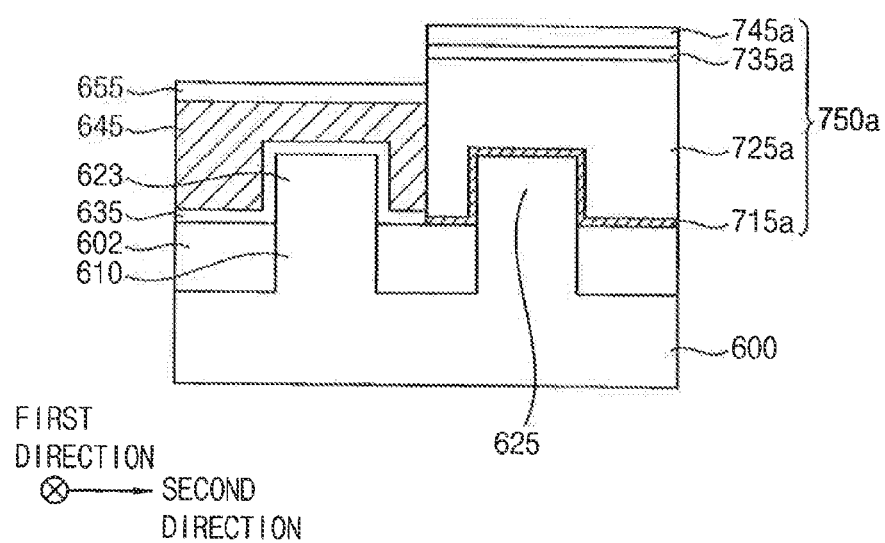
Figure 45:
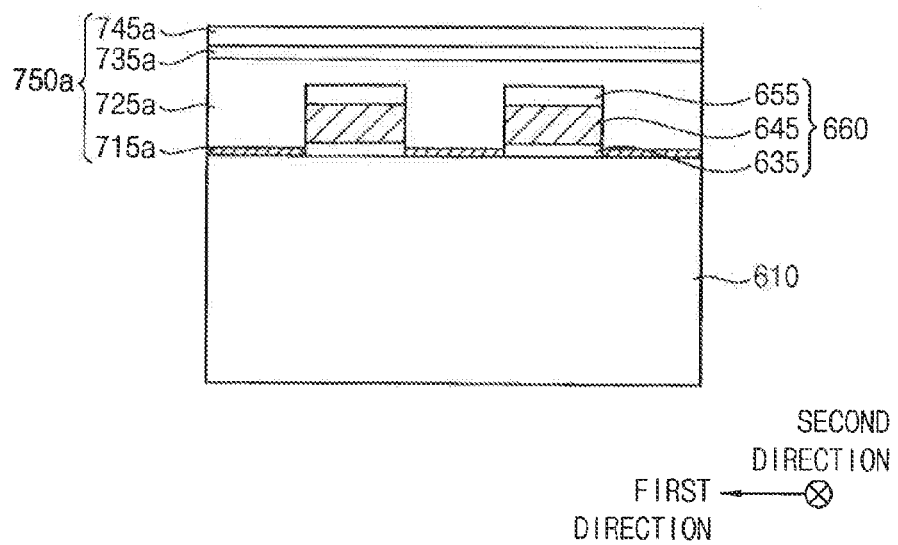

Referring to FIGS. 43 to 45, processes substantially the same as or similar to those illustrated with reference to FIGS. 9 and 10 may be performed. Accordingly, a first ion implantation mask 750a exposes the first semiconductor fin 623. The first ion implantation mask 750a covers the second semiconductor fin 625. The first ion implantation mask 750a includes a first protective layer pattern 715a, a mask layer pattern 725a, a second protective layer pattern 735a and a photoresist pattern 745a.

The first ion implantation mask 750a also covers portions of the isolation layer 602 and the gate structure 660 adjacent to the second semiconductor fin 625.

Figure 46:
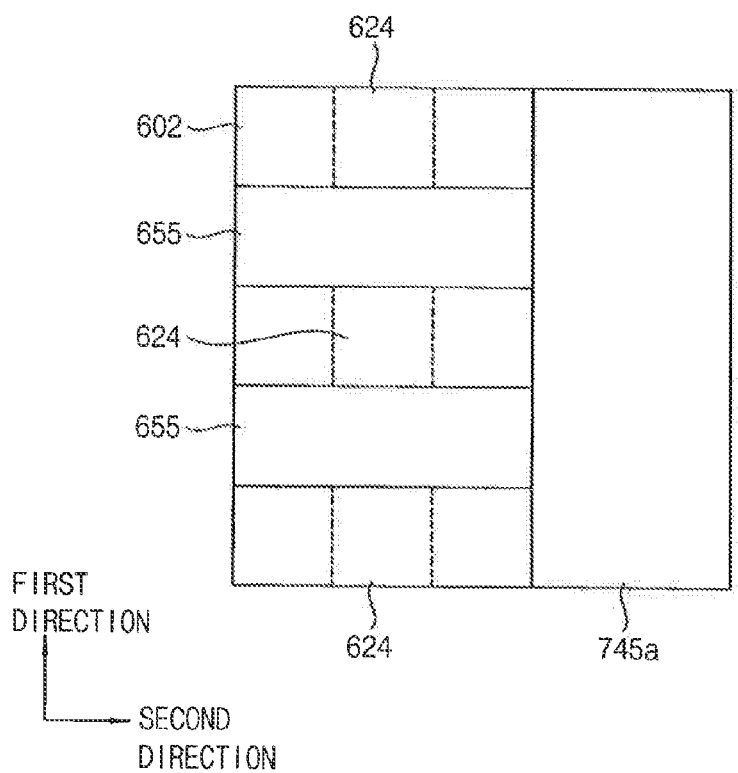
Figure 47:
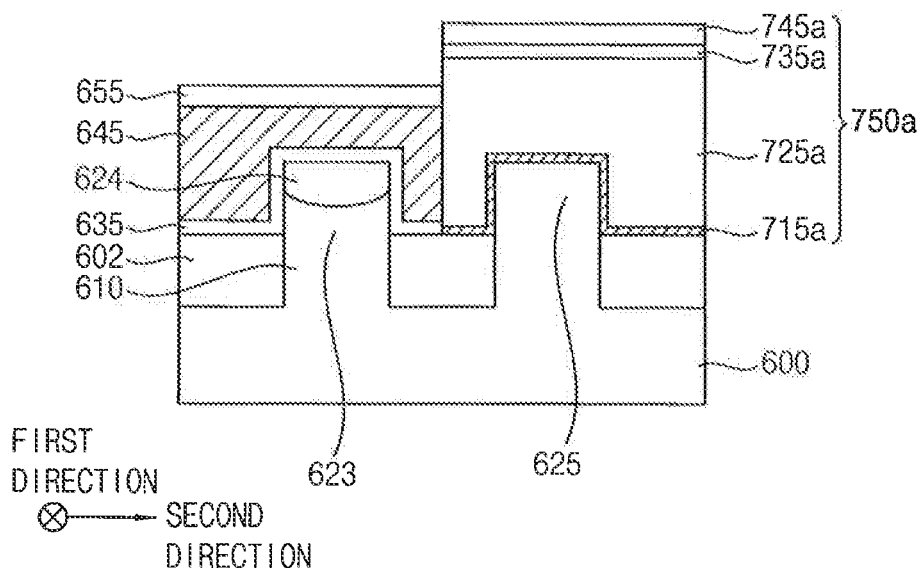
Figure 48:
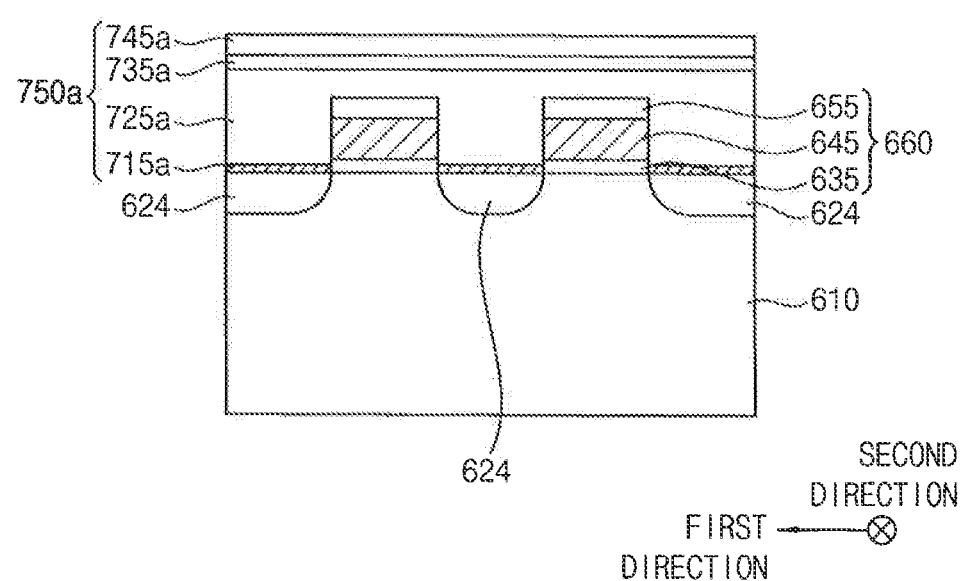

Referring to FIGS. 46 to 48, a first impurity implantation 624 is formed in an upper portion of the first semiconductor fin 623 using the first ion implantation mask 750a. The upper portion of the first semiconductor fin 623 is adjacent to the gate structure 660.

Figure 49:
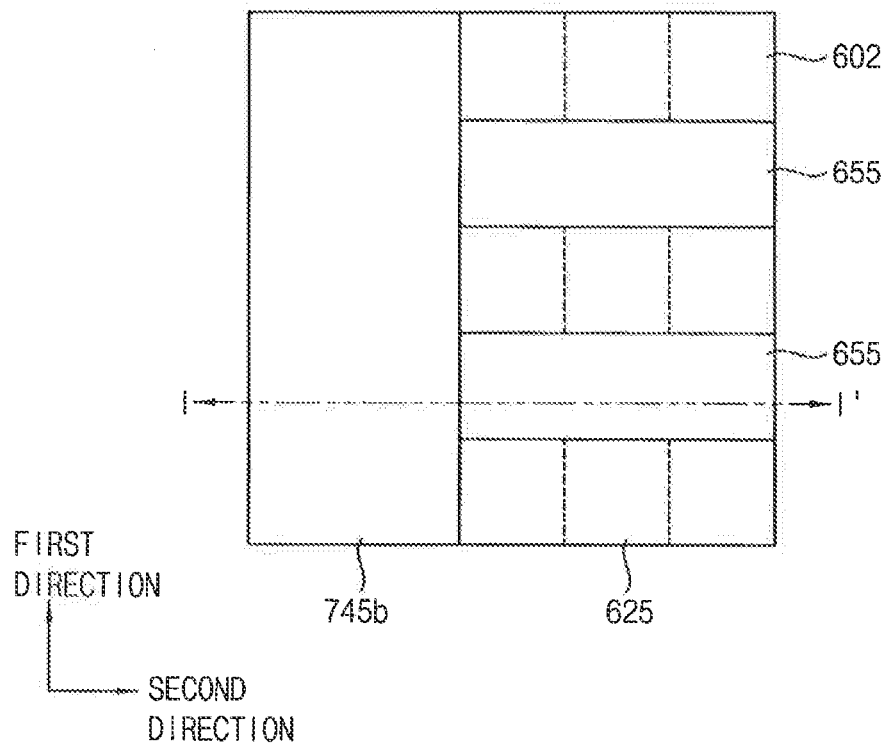
Figure 50:
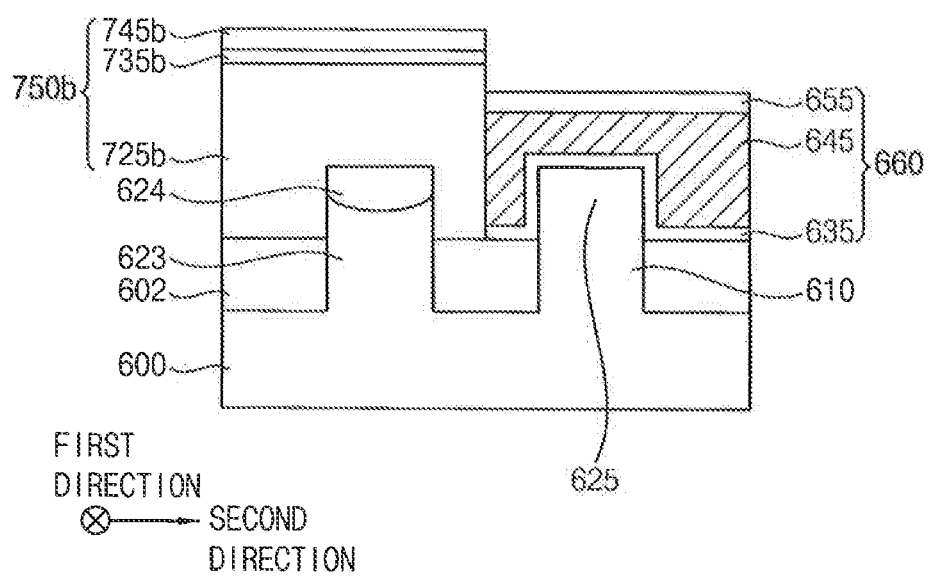

Referring to FIGS. 49 and 50, processes substantially the same as or similar to those illustrated with reference to FIGS. 12 to 15 may be performed. Accordingly, a second ion implantation mask 750b exposes the second semiconductor fin 625.

The second ion implantation mask 750b covers the first semiconductor fin 623 and includes a mask layer pattern 725b, a second protective layer pattern 735b and a photoresist pattern 745b sequential stacked on each other. The second ion implantation mask 750h also covers portions of the isolation layer 602 and the gate structure 660.

Figure 51:
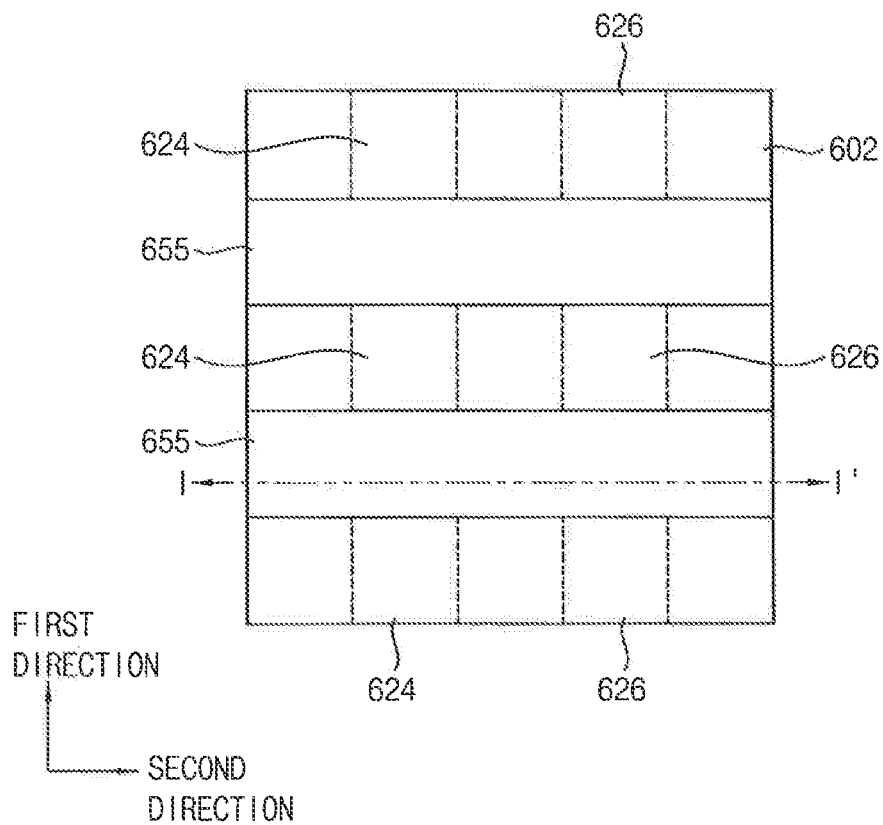
Figure 52:
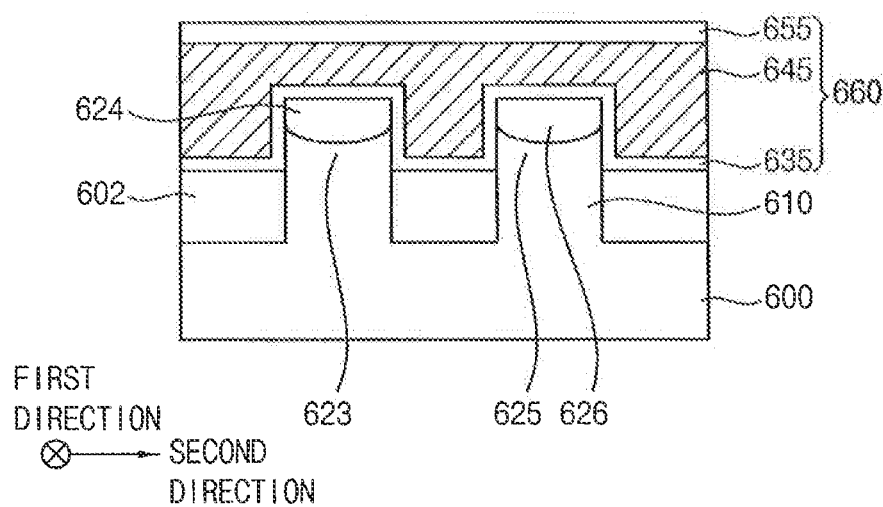

Referring to FIGS. 51 and 52, a second impurity implantation 626 may be formed, using the second ion implantation mask 750b, in an upper portion of the second semiconductor fin 625 adjacent to the gate structure 660. The second ion implantation mask 750h may be removed by an ashing process and/or a strip process after the formation of the second impurity region 626.

An insulating interlayer covering the gate structures 660 and the semiconductor fins 623 and 625 may be formed. Plugs may be formed through the insulating interlayer to contact the impurity regions 624 and 626, and wirings electrically connected to the plugs be formed to obtain the semiconductor device.

The semiconductor device having a FinFET structure may include stepped portions due to the gate structure 660 and the semiconductor fins 623 and 625. Thus, if the impurity region is formed using a single-layered photoresist pattern as an ion implantation mask, the PR-tail may occur to cause an irregular or non-uniform impurity implantation. According to an exemplary embodiment, the multi-layered ion implantation mask may be applied to the semiconductor device having a FinFET structure so that the impurity region may be reliably formed with respect to its depth, concentration, and/or dimension.

The methods of forming impurity regions according to an exemplary embodiment may be utilized for semiconductor devices including gate structures of a fine pitch or a plurality of stepped portions. For example, the methods may be applied to FinFET devices, static random access memory (SRAM) devices including the gate structures of a fine and narrow pitch, etc.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method of manufacturing a semiconductor device, comprising:
   forming gate structures on a substrate;
   forming a first protective layer, a mask layer, a second protective layer and a photoresist layer sequentially on the substrate to cover the gate structures;
   forming a photoresist pattern by partially removing the photoresist layer;
   forming an ion implantation mask by sequentially etching the second protective layer, the mask layer and the first protective layer using the photoresist pattern, wherein the ion implantation mask exposes at least one of the gate structures; and
   implanting impurities in an upper portion of the substrate through the ion implantation mask,
   wherein the first protective layer includes polysilicon, metal or metal nitride.

2. The method of claim 1,
   wherein the second protective layer includes at least one of silicon oxide and silicon oxynitride, and the mask layer includes a spin-on hard mask material.

3. The method of claim 2,
   wherein the mask layer includes at least one of carbon-based polymer and an amorphous carbon.

4. The method of claim 2,
   wherein the second protective layer and the mask layer are etched by a dry etching process using different etching gases from each other.

5. The method of claim 1,
   wherein the first protective layer is etched by a wet etching process using an etchant solution that contains a hydroxyl group.

6. The method of claim 1,
   wherein the first protective layer is etched by a wet etching process using an etchant solution that contains hydrogen peroxide.

7. The method of claim 1,
   wherein the first protective layer is etched by a dry etching process.

8. The method of claim 7,
   wherein the dry etching process is performed using a fluorine-based gas.

9. The method of claim 8, further comprising removing the photoresist pattern before the implanting the impurities in the upper portion of the substrate, and wherein the second protective layer is in-situ removed by the dry etching process together with the first protective layer.

10. The method of claim 1,
    wherein the forming of the ion implantation mask includes entirely removing the second protective layer and the photoresist layer.

11. A method of manufacturing a semiconductor device, comprising:
    forming a first gate structure and a second gate structure on a substrate;
    forming a spacer layer covering the first gate structure and the second gate structure;
    forming a first ion implantation mask covering the second gate structure, wherein the first ion implantation mask includes a first protective layer pattern directly on the spacer layer and a mask layer pattern on the first protective layer pattern;
    forming a first impurity region in an upper portion of the substrate through by the first ion implantation mask;
    removing the first ion implantation mask;
    forming a second ion implantation mask covering the first gate structure, wherein the second ion implantation mask includes a mask layer pattern; and
    forming a second impurity region in an upper portion of the substrate through by the second ion implantation mask,
    wherein the first protective layer pattern includes polysilicon, metal or metal nitride.

12. The method of claim 11,
    wherein the first and the second gate structures are formed in a cell region, and
    wherein the substrate further includes at least one peripheral circuit region adjacent to the cell region and at least one third gate structure is formed in the peripheral circuit region.

13. The method of claim 12, further comprising forming a third impurity region in the peripheral circuit region,
    wherein the forming the third impurity region includes:
    forming a photoresist layer covering the substrate;

partially removing the photoresist layer to form a third ion implantation mask, wherein the peripheral circuit region is exposed by the third ion implantation mask; and implanting impurities at an upper portion of the peripheral circuit region of the substrate.

14. The method of claim 11,
wherein the first ion implantation mask further comprises a second protective layer pattern and a photoresist pattern, and
wherein the second protective layer pattern is interposed between the mask layer pattern and the photoresist pattern.

15. A method of manufacturing a semiconductor device, comprising:
 forming a plurality of first gate structures and a plurality of second gate structures on a substrate, wherein the plurality of first gate structures are spaced apart at a first spacing from each other and the plurality of second gate structures are spaced apart at a second spacing from each other;
 forming a first ion implantation mask having a first opening, wherein the first ion implantation mask exposes the plurality of first gate structures through the first opening and covers the plurality of second gate structures, and wherein the first ion implantation mask includes a first protective layer pattern and a mask layer pattern;
 after the forming of the first ion implantation mask, forming a plurality of first impurity regions by implanting a first impurity into the substrate using the first ion implantation mask, forming a second ion implantation mask having a second opening, wherein the second ion implantation mask exposes the plurality of second gate structures through the second opening and covers the plurality of first gate structures, wherein the second ion implantation mask includes a photoresist pattern only; and
 after the forming of the second ion implantation mask, forming a plurality of second impurity regions by implanting a second impurity into the substrate using the second ion implantation mask,
 wherein the first protective layer pattern includes polysilicon, metal or metal nitride,
 wherein the first spacing is smaller than the second spacing.

16. The method of claim 15, further comprising removing the first ion implantation mask after the forming of the plurality of the first impurity regions, and wherein the forming of the first ion implantation mask is performed before the forming of the second ion implantation mask.

17. The method of claim 15,
wherein the first ion implantation mask further comprises a second protective layer pattern and a photoresist pattern, and
wherein the second protective layer pattern is interposed between the mask layer pattern and the photoresist pattern.

* * * * *